US008233326B2

United States Patent
Yuda

(10) Patent No.: US 8,233,326 B2
(45) Date of Patent: Jul. 31, 2012

(54) SEMICONDUCTOR NON-VOLATILE MEMORY, CHARGE ACCUMULATING METHOD FOR SEMICONDUCTOR NON-VOLATILE MEMORY, CHARGE ACCUMULATING PROGRAM STORAGE MEDIUM

(75) Inventor: Takashi Yuda, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 333 days.

(21) Appl. No.: 12/724,666

(22) Filed: Mar. 16, 2010

(65) Prior Publication Data

US 2010/0238734 A1  Sep. 23, 2010

(30) Foreign Application Priority Data

Mar. 19, 2009  (JP) ................. 2009-068521

(51) Int. Cl.
*G11C 16/06*  (2006.01)
(52) U.S. Cl. ........... 365/185.18; 365/183; 365/148; 365/100
(58) Field of Classification Search ........... 365/185.18, 365/183, 148, 100
See application file for complete search history.

(56) References Cited

U.S. PATENT DOCUMENTS
2006/0081941 A1* 4/2006 Iwata et al. ............ 257/379

FOREIGN PATENT DOCUMENTS
| JP | 10-027486 | 1/1998 |
| JP | 2005-064295 | 3/2005 |
| JP | 2008-085196 | 4/2008 |

OTHER PUBLICATIONS

Eitan et al., "4-bit per Cell NROM Reliability", IEEE International Electron Devices Meeting 205: iedm Technical Digest: Washington, DC: Dec. 5-7, 2005, USA, IEEE, 2005, Session 22.1.

* cited by examiner

*Primary Examiner* — Thong Q Le
(74) *Attorney, Agent, or Firm* — Volentine & Whitt, PLLC

(57) ABSTRACT

There is provided a semiconductor non-volatile memory including: plural memory sections, a voltage application section, and a control section that controls the voltage application section wherein the control section controlling voltage application such that, based on a value of current detected by a current detection section, in a region where the current flowing in a channel region is greater than a predetermined target value at which a amount of charge accumulated has become a specific value in at least one of a first charge accumulating section or a second charge accumulating section, when a value of current flowing in the channel region approaches a target value, a rate of increase in the charge accumulating amount per time is decreased at least once.

8 Claims, 27 Drawing Sheets

SEMICONDUCTOR NON-VOLATILE MEMORY, CHARGE ACCUMULATING METHOD FOR SEMICONDUCTOR NON-VOLATILE MEMORY, CHARGE ACCUMULATING PROGRAM STORAGE MEDIUM

CROSS-REFERENCE TO RELATED APPLICATION

This application is based on and claims priority under 35 USC 119 from Japanese Patent Application No. 2009-068521 filed on Mar. 19, 2009, the disclosure of which is incorporated by reference herein.

BACKGROUND

1. Technical Field

The present invention relates to a semiconductor non-volatile memory, a charge accumulating method for a semiconductor non-volatile memory, and a charge accumulating program storage medium. The present invention particularly relates to a semiconductor non-volatile memory that applies a voltage plural times between a gate electrode and at least one of a source electrode and/or a drain electrode until an amount of charge accumulated in an charge accumulating section becomes a specific value, and changes the voltage application state such that the charge accumulating amount per time is increased as the number of times of voltage application increases. The present invention also particularly relates to a charge accumulating method and a charge accumulating program storage medium of such a semiconductor non-volatile memory.

2. Related Art

Conventionally, there is a semiconductor non-volatile memory that has two charge accumulating sections provided in a single memory cell, and can store 2-bit data in a single memory cell by storing data of two values ("0" or "1") in the respective charge accumulating sections.

For example, a semiconductor non-volatile memory is disclosed in Japanese Patent Application Laid-Open (JP-A) No. 2005-64295 having a structure in which two charge accumulating sections made from a silicon nitride film are formed physically discontiguous to each other at the two outside faces of the gate electrode of a memory cell.

In a semiconductor non-volatile memory of such a structure, 2-bit data can be stored in a single memory cell by storing data of two values, 0" or "1", in the respective charge accumulating sections of the memory cell. FIG. 23 is a schematic diagram of a memory cell of the semiconductor non-volatile memory described in JP-A No. 2005-64295 showing the states that can be adopted thereby. Namely, the initial state is one in which there is no charge (electrons) accumulated in each of the charge accumulating sections of the memory cell, corresponding to data "1", and a state in which charge has been accumulated corresponds to data "0". 2-bit data can thereby be stored in a single memory cell.

Writing to, reading from, and erasing in the semiconductor non-volatile memory of such a structure are respectively performed in the following ways.

For example, consider the case where, as described above, the initial state in which there is no charge accumulated in the charge accumulating sections corresponds to data 1, and the state in which charge is accumulated in the charge accumulating sections corresponds to data "0". In such a case, writing data "0" to the drain side is firstly performed by application of a positive voltage to the drain region (drain electrode), application of a positive voltage to the gate electrode, and connecting the source region to ground potential. By so doing, hot electrons are injected into the charge accumulating section at the drain side, resulting in data "0" being written.

Reading the data of the drain side is performed by applying a positive voltage to the source region, applying a positive voltage to the gate electrode, and connecting the drain region to the ground potential. When there is no charge accumulated in the charge accumulating section of the drain side, sufficient read current value is obtained. In such a case, determination is made that data "1" is written therein. However, when there is charge accumulated in the charge accumulating section of the drain side, the read current value is low. In such a case, determination is made that data "0" is written therein. In this manner, two values of data "0" and "1" are discriminated between by whether or not the read current value is a specific value or greater.

Erasing of data on the drain side, namely operation to return to the initial state in which there is no charge accumulated in the charge accumulating section (the state corresponding to data "1") is performed by applying a positive voltage to the drain region, applying 0 or a negative voltage to the gate electrode, and placing the source region in an open state (floating state). By so doing, hot holes generated in the periphery of the drain region are injected into the charge accumulating section, and data erasure can be performed by neutralizing the charge accumulated in the charge accumulating section. Note that erasure of data can also be accomplished by irradiation of ultraviolet radiation or by heat treatment.

In this manner, the semiconductor non-volatile memory of the structure described in JP-A No. 2005-64295 discriminates between the two values of data "0" or "1" according to the magnitude of the read current value. Ideally the read current value adopts the same values, according to "0" or "1" data, for all of the memory cells. However, in practice a degree of variation occurs for each of the memory cells due to circumstances, such as variations in processes and the like.

FIG. 24 is a graph showing, in a integration of plural memory cells, read current values on the horizontal axis, and showing the number of individual charge accumulating sections of memory cells that adopt each of these read current values on the vertical axis. The distribution (current value distribution) is thereby shown, centered on the theoretical current value according to the data of "0" or "1", respectively. Note that the range of current values of a given width between the distribution (current value distribution) of the charge accumulating sections expressing data "0" and the distribution of the charge accumulating sections expressing data "1" is referred to as the "current window". In order to discriminate correctly between whether "0" or "1" has been written, the current value distribution width needs to be narrow, and for a current window of sufficient width to be present. Recently, attempts have started to try and realize storage of 4-bit data in a single memory cell, in a semiconductor non-volatile memory provided with two charge accumulating sections for each memory cell.

For example, in the article "4-bit per Cell NROM Reliability", by Boaz Eitan and 11 others, published in IEEE International Electron Devices Meeting 2005: iedm Technical Digest: Washington, D.C.: Dec. 5 to 7, 2005, USA, IEEE, 2005, Session 22.1, a structure is described with charge accumulating section at both ends of a single silicon nitride film formed contiguously below a gate electrode of a memory cell, and 4-bit data is stored per single memory cell by storing data of 4 values ("00", "01", "10", in sequence from the greatest charge accumulated, and "11" with no charge accumulated").

Furthermore, the importance of taking countermeasures against cross talk between the two end sections of the cell, and the need to ensure that correct writing is performed, is reported therein.

Writing 4-bits to each of the respective cells at the same time is reported as a countermeasure against cross talk. Performing two stages of writing is reported as a specific example of a writing method. The two stages of writing are a first stage for performing fast writing, and a second stage for performing accurate writing. Writing is commenced at the first stage with a given drain voltage (3V in FIG. 4 of the above publication by Boaz Eitan et al.), and so-called drain stepping is performed, in which the drain voltage is gradually raised as the number of times of writing increases, and writing is ceased just before a respective charge accumulating section has reached the desired threshold value voltage. Writing is commenced at the second stage from a specific gate voltage (7V in FIG. 4 of the above publication by Boaz Eitan et al.), and the desired threshold value voltage is achieved in the respective charge accumulating sections by performing so-called gate stepping, in which the gate voltage is raised as the number of times of writing increases. It is reported that the accuracy of writing can be raised by this two stage writing.

A writing method of applying voltage and confirming the write amount (or the read current value) in sequence for each of the charge accumulating sections to give the desired write amount (or the read current value) by plural repetitions in this manner, is referred to as "verify writing". In verify writing, a greater precision in the desired writing amount can be achieved, in comparison to methods in which the desired writing amount is made by a single voltage application.

However, there is a known problem, called word line disturbance, relating to writing in non-volatile memories, such as, for example, flash memories or the like (JP-A No. 10-27486). Word line disturbance is a phenomenon in which, during write operation of a bit, a high voltage is applied to non-selected memory cells with a common word line, leading to occurrence of a weak written (disturbed) state, so that the threshold voltage thereof fluctuates and the stored data is changed. A technique of writing in sequence from the memory cells requiring the deepest writing is reported in JP-A No. 10-27486 as a counter measure to word line disturbance.

In a semiconductor non-volatile memory provided with two charge accumulating sections per single memory cell, there is a problem that due to the writing operation of one of the charge accumulating sections, the read current value falls of the other of the charge accumulating sections in the same memory cell (referred to as the "mirror side").

For example, in the semiconductor non-volatile memory of JP-A No. 2005-64295, when 2-bit data is stored per single memory cell, namely when data of two values "0" or "1" is stored in a single charge accumulating section, in a case where "0" is stored in one charge accumulating section (for example on the source side) from the two charge accumulating sections of a single memory cell, and "1" is stored in the other charge accumulating section (for example on the drain side). In order to store "0" in the source side, it is necessary to perform writing operation on the source side charge accumulating section, to trap charge. However, when writing operation is performed to the source side charge accumulating section, the read current value on the drain side becomes lower than the desired read current value. This is thought to be caused mainly by charge that has been accumulated on the source side charge accumulating section impeding the current flowing when reading operation is performed to the drain side.

Note that this problem is not limited to semiconductor non-volatile memories provided with two charge accumulating sections per single memory cell, and also occurs in semiconductor non-volatile memories provided with three or more charge accumulating sections per single memory cell. FIG. 25 is a graph showing a state in which, in an integration of plural memory cells, the read current value of the mirror side falls. In the graph, similar to in FIG. 24, the horizontal axis is the read current values, and the number of individual charge accumulating sections of memory cells that adopt each read current value is shown on the vertical axis. The solid lines show the read current value distribution (current value distribution) of data in the state prior to performing writing to the other of the charge accumulating sections in the same memory cell, and the broken line shows the data current value distribution (current value distribution) of the mirror side after writing has been performed to the other charge accumulating section in the same memory cell. In this manner, the current window between "0" and "1" gets narrower due to the read current value of "1" falling as a whole.

However, not only is there such a fall in read current value on the mirror side (FIG. 25), but also, as shown in FIGS. 26A, 26B, the current window is also made narrower due to the width of the current value distribution widening. Namely, if the gate current remains low, then due to there being memory cells that are not sufficiently written (charge is not sufficiently accumulated), as shown by A in FIG. 26A, the current value distribution width widens, and the current window becomes narrower. However, if in contrast, the gate current remains high, as shown by B in FIG. 26B, then due to there being memory cells that are over written (charge is over accumulated), the current value distribution width widens, and the current window becomes narrower.

From this standpoint, if 2-bit data is stored per memory cell then by raising the precision of writing by verify writing as described above, the read current value distribution width can be made narrow, and a certain degree of current window can be secured.

However, when 4-bit data is stored per memory cell in a semiconductor non-volatile memory provide with two charge accumulating sections per single memory cell, then data of 2-bits (4 values) are written to each of the charge accumulating sections. For example, FIG. 27 is a schematic diagram showing the states that should be adopted by each of the charge accumulating sections of a memory cell when data of 4-bits per single memory cell is stored in the semiconductor non-volatile memory described in JP-A No. 2005-64295. Furthermore, FIG. 28 is a graph showing an ideal read current value distribution in an integration of plural memory cells, with the read current value on the horizontal axis, and the number of individual memory cells that adopt each read current value on the vertical axis. In this manner, the current window becomes narrower than where there are two bits per single memory cell.

Therefore, as shown in FIG. 29, when the read current value falls on the mirror side, it is difficult to secure a current window to perform verify writing. For example, consider the read current value when the initial state of one of the charge accumulating sections is the "11" state. In such a case, although a fall in the read current value does not occur when the other charge accumulating section is also in the "11" state, if the other charge accumulating section has "00" data written therein, the read current value of the first charge accumulating section falls. Therefore, the current window between "10" and "11" gets narrower. Since a phenomenon like this occurs for all data, it is difficult to secure sufficient current window.

Note that in FIG. 29, the solid lines show the distribution of data read current values of the first charge accumulating section prior to performing writing to the other charge accumulating section in the same memory cell, and the broken lines show the distribution of data current values in the first charge accumulating section after writing has been performed to the other charge accumulating section in the same memory cell.

However, in order to make the above current value distribution widths narrower, in the technology of JP-A No. 2008-85196, the sequence of writing to the memory cells is made such that writing occurs in sequence from the memory cells for which the charge to be accumulated is the greatest. Namely, as shown in FIG. 30A, firstly writing is performed plural times, at the same respective time, to each of plural memory cells to which 00 is to be written, secondly writing is performed plural times, at the same respective time, to each of plural memory cells to which 01 is to be written, then finally writing is performed plural times, at the same respective time, to each of plural memory cells to which 10 is to be written.

In such cases, the gate voltage and the drain voltage (the source voltage similarly) change in the following manner. Namely, first, as shown in FIG. 30B, when 00 is being written to each of the memory cells, the gate voltage is gradually increased, from a starting value of 9.0V, as the number of times of writing increases, and is then made constant after it has reached 10.0V. Furthermore, when 01 is being written to each of the memory cells, the gate voltage is gradually increased, from a starting value of 7.5V, as the number of times of writing increases. Then when 10 is being written to each of the memory cells, the gate voltage is gradually increased, from a starting value of 7.0V, as the number of times of writing increases.

The drain voltage, as shown in FIG. 30C, is always constant (6.5V), independent of the number of times of writing.

In the technology of above JP-A No. 2008-85196, the drain voltage (the source voltage similarly) is gradually increased as the number of times of writing increases, however, since the drain voltage is constant, memory cells exist which have been excessively written, as shown in FIG. 21A, the current value distribution width H1 widens, and the current window becomes narrower.

SUMMARY

The present invention provides a semiconductor non-volatile memory capable of making the current value distribution width narrow and widening the current window, a charge accumulating method of a semiconductor non-volatile memory, and a charge accumulating program storage medium.

A first aspect of the present invention provides a semiconductor non-volatile memory including:

plural memory sections, each memory section including:

a substrate, equipped with a source region, a drain region, a channel region between the source region and the drain region, a first variable resistance region between the channel region and the source region, the first variable resistance region having a specific concentration of an impurity and having a variable resistance, and a second variable resistance region between the channel region and the drain region, the second variable resistance region having a specific concentration of an impurity and having a variable resistance;

a source electrode, disposed in a position on the substrate corresponding to the source region;

a drain electrode, disposed in a position on the substrate corresponding to the drain region;

a gate electrode, disposed in a position on the substrate corresponding to the channel region;

a current detection section that detects a value of current flowing in the channel region;

at least one first charge accumulating section, disposed in a position on the substrate corresponding to the first variable resistance region, and accumulating charge of an amount corresponding to an application state of voltage applied to the source electrode and the gate electrode; and at least one second charge accumulating section, disposed in a position on the substrate corresponding to the second variable resistance region, and accumulating charge of an amount corresponding to the application state of voltage applied to the drain electrode and the gate electrode;

a voltage application section that selectively applies a voltage to the source electrode, the drain electrode, and the gate electrode; and a control section that controls the voltage application section, such that voltage is applied plural times between the gate electrode and at least one of the source electrode or the drain electrode, until the amount of charge accumulated in at least one of the respective first charge accumulating section or the respective second charge accumulating section of the plural memories is a specific value, and changes the voltage application state such that as the number of times that the voltage is applied increases, a charge accumulating amount per time increases, wherein the control section controlling voltage application such that, based on a value of current detected by the current detection section, in a region where the current flowing in the channel region is greater than a predetermined target value at which the amount of charge accumulated has become a specific value in at least one of the first charge accumulating section or the second charge accumulating section, when a value of current flowing in the channel region approaches the target value, a rate of increase in the charge accumulating amount per time is decreased at least once.

The semiconductor non-volatile memory of the first aspect may be configured such that, the control section controls the voltage application section such that a value of the voltage applied to the gate electrode is increased gradually according to the increase in number of times that the voltage is applied, and the value of the voltage applied to at least one of the source electrode or the drain electrode is made smaller stepwise according to a value of the current flowing in the channel region.

The semiconductor non-volatile memory of the first aspect may be configured such that the control section controls the voltage application section such that a value of the voltage applied to the gate electrode is made smaller stepwise according to a value of the current flowing in the channel region and the value of the voltage applied to at least one of the source electrode or the drain electrode is increased gradually according to the increase in number of times.

The semiconductor non-volatile memory of the first aspect may be configured such that the control section increases the voltage applied to at least one of the gate electrode, the source electrode, or the drain electrode according to the increase in number of times that the voltage is applied, and a rate of increase is made smaller stepwise according to the value of the current flowing in the channel region.

The semiconductor non-volatile memory of the first aspect may be configured such that the control section controls the voltage application section, such that selective accumulating is made of one or other of a plurality of charges of different magnitudes in at least one of the respective first charge accumulating section or the respective second charge accumulating section of the plurality of memory sections, and voltage is applied either at the same time, or successively, to a plurality of memory cells to trap charge of the same magnitude.

The semiconductor non-volatile memory of the first aspect may be configured such that the control section controls the voltage application section such that a respective sequence of the plurality of memory sections is commuted, and selective accumulating is made of one or other of a plurality of charges of different magnitudes in at least one of the first charge accumulating section or the second charge accumulating section of each of the plurality of memory sections.

A second aspect of the present invention provides a semiconductor non-volatile memory charge accumulating method for a semiconductor non-volatile memory including:

a plurality of memory sections, each memory section including:
  a substrate, equipped with a source region, a drain region, a channel region between the source region and the drain region, a first variable resistance region between the channel region and the source region, the first variable resistance region having a specific concentration of an impurity and having a variable resistance, and a second variable resistance region between the channel region and the drain region, the second variable resistance region having a specific concentration of an impurity and having a variable resistance;
  a source electrode, disposed in a position on the substrate corresponding to the source region;
  a drain electrode, disposed in a position on the substrate corresponding to the drain region;
  a gate electrode, disposed in a position on the substrate corresponding to the channel region;
  a current detection section that detects a value of current flowing in the channel region;
  at least one first charge accumulating section, disposed in a position on the substrate corresponding to the first variable resistance region, and accumulating charge of an amount corresponding to an application state of voltage applied to the source electrode and the gate electrode; and
  at least one second charge accumulating section, disposed in a position on the substrate corresponding to the second variable resistance region, and accumulating charge of an amount corresponding to the application state of voltage applied to the drain electrode and the gate electrode;
a voltage application section that selectively applies a voltage to the source electrode, the drain electrode, and the gate electrode; and
a control section that controls the voltage application section, such that voltage is applied a plurality of times between the gate electrode and at least one of the source electrode or the drain electrode, until the amount of charge accumulated in at least one of the respective first charge accumulating section or the respective second charge accumulating section of the plurality of memories is a specific value, and changes the voltage application state such that as the number of times that the voltage is applied increases, a charge accumulating amount per time increases, the method comprising:
  by the control section, determining, based on a value of current detected by the current detection section, in a region where the current flowing in the channel region is greater than a predetermined target value at which the amount of charge accumulated has become a specific value in at least one of the first charge accumulating section or the second charge accumulating section, whether or not the value of current flowing in the channel region approaches the target value, and
  by the control section, controlling the voltage application section such that the rate of increase in the charge accumulating amount per time is decreased when it is determined that the value of current approaches the target value.

A third aspect of the present invention provides a charge accumulating program storage medium that stores a charge accumulating program that instructs a computer executing steps for accumulating a charge in a semiconductor non-volatile memory comprising a plurality of memory sections, each memory section including:

a substrate, equipped with a source region, a drain region, a channel region between the source region and the drain region, a first variable resistance region between the channel region and the source region, the first variable resistance region having a specific concentration of an impurity and having a variable resistance, and a second variable resistance region between the channel region and the drain region, the second variable resistance region having a specific concentration of an impurity and having a variable resistance;
a source electrode, disposed in a position on the substrate corresponding to the source region;
a drain electrode, disposed in a position on the substrate corresponding to the drain region;
a gate electrode, disposed in a position on the substrate corresponding to the channel region;
a current detection section that detects a value of current flowing in the channel region;
at least one first charge accumulating section, disposed in a position on the substrate corresponding to the first variable resistance region, and accumulating charge of an amount corresponding to an application state of voltage applied to the source electrode and the gate electrode; and
at least one second charge accumulating section, disposed in a position on the substrate corresponding to the second variable resistance region, and accumulating charge of an amount corresponding to the application state of voltage applied to the drain electrode and the gate electrode;
a voltage application section that selectively applies a voltage to the source electrode, the drain electrode, and the gate electrode; and
a control section that controls the voltage application section, such that voltage is applied a plurality of times between the gate electrode and at least one of the source electrode or the drain electrode, until the amount of charge accumulated in at least one of the respective first charge accumulating section or the respective second charge accumulating section of the plurality of memories is a specific value, and changes the voltage application state such that as the number of times that the voltage is applied increases, the charge accumulating amount per time increases, wherein
  the steps including:
  by the control section, determining, based on a value of current detected by the current detection section, in a region where the current flowing in the channel region is greater than a predetermined target value at which the amount of charge accumulated has become a specific value in at least one of the first charge accumulating section or the second charge accumulating section, whether or not the value of current flowing in the channel region approaches the target value, and
  by the control section, controlling the voltage application section such that a rate of increase in the charge accumulating amount per time is decreased when it is determined that the value of current approaches the target value.

According to the present invention, the effect is exhibited that the current value distribution width can be narrowed and the current window can be widened, due to, in a region where the current flowing in the channel region is greater than a predetermined target value at which the amount of charge accumulated in the charge accumulating section is a specific value, the rate of increase in the charge accumulating amount per time is decreased at least once when the value of current flowing in the channel region approaches to the target value.

BRIEF DESCRIPTION OF THE DRAWINGS

Exemplary embodiments of the present invention will be described in detail based on the following figures, wherein.

DETAILED DESCRIPTION

Detailed explanation follows of preferably exemplary embodiments of the present invention, with reference to the drawings. Note that the shapes, sizes and placement relationships of each of the configuration elements in each of the drawings are merely schematic illustrations thereof, at a level enabling understanding of the invention. Consequently, the invention is not limited by the illustrated examples.

First Exemplary Embodiment

Structure of Memory Cell

Figure 1:
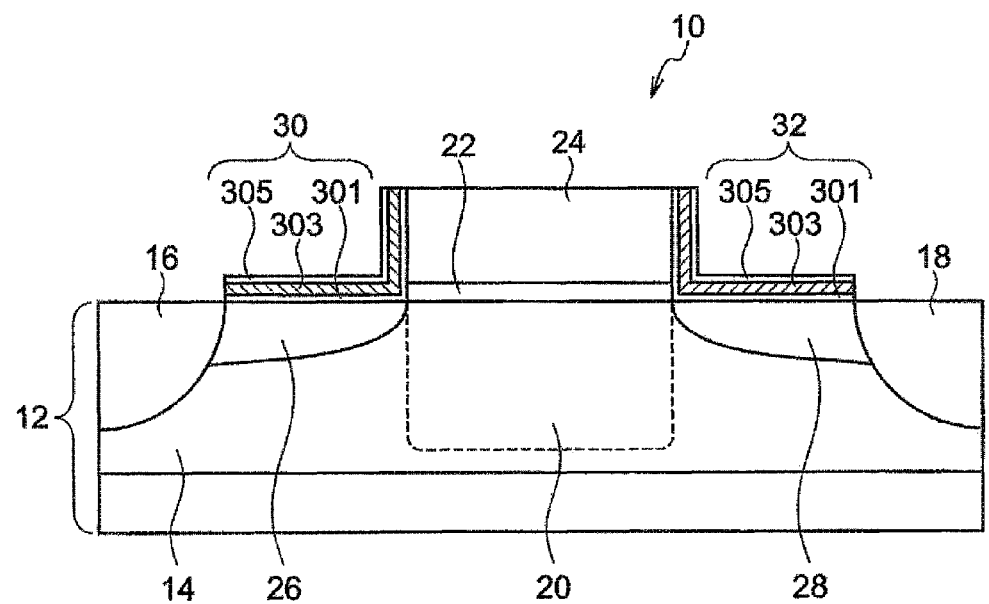
FIG. 1 is a cross-section showing a structure of a memory cell according to each exemplary embodiment.

FIG. 1 is a schematic cross-section diagram showing relevant parts of a memory cell 10 (memory section) configuring a semiconductor non-volatile memory of the present exemplary embodiment. Explanation follows in the present exemplary embodiment of an example of a case where the memory cell 10 is an n-type Metal Oxide Semiconductor Field Effect Transistor (n-MOSFET).

As shown in FIG. 1, the memory cell 10 is configured with a p-well region 14 formed on front face region side of a silicon substrate 12 (substrate), serving as a p-type semiconductor substrate. A source region 16 and a drain region 18, each including a high concentration of an n-type impurity ($n^+$-type), are provided on surface regions of the p-well region 14, separated from each other by a specific separation distance. Note that the source region 16 and the drain region 18 are each provided with a metal electrode layer (not shown in the figures) with a contact layer (not shown in the figures) disposed between the source region 16 or the drain region 18 and the metal electrode layer. The contact layers and the metal electrode layers configure the source electrode and the drain electrode respectively. In the following explanation, reference is made to source region and drain region, and these are equivalent to the source electrode and the drain electrode, respectively.

A gate electrode 24, this being a control electrode, is formed on a partial region above the p-well region 14, where the source region 16 and the drain region 18 get closer together, with a gate insulating film 22 formed as a first insulating film between the p-well region 14 and the gate electrode 24. A channel forming region 20 (channel region) is formed at the part of the surface region of the p-well region 14 where the source region 16 and the drain region 18 get closer together, the channel forming region 20 being a channel (current path) between the source and the drain regions when operating as an n-MOSFET. The gate insulating film (gate oxide film) here is a silicon oxide film ($SiO_2$) and the gate electrode 24 is of poly-silicon (poly-crystalline silicon). Since the structure of the above described n-MOSFET is already known, detailed explanation thereof is omitted.

In the present exemplary embodiment, a first variable resistance region 26 is provided in contact with the source region 16, between the source region 16 and the channel forming region 20. A second variable resistance region 28 is provided in contact with the drain region 18, between the drain region 18 and the channel forming region 20.

Both the first and second variable resistance regions (26, 28) are ($n^-$-type) regions, with a lower concentration of n-type impurity than the corresponding source region 16 or drain region 18. The first and second variable resistance regions (26, 28) are for selectively injecting charge to first and second charge accumulating sections (30, 32), described below, in order to concentrate field at the periphery of the first and second variable resistance regions (26, 28). As a result, generation of a hot carrier can be concentrated in the variable resistance regions. The concentration and the spread region (width and thickness) of variable resistance regions can be appropriately set according the application and design. The structure of the variable resistance regions (26, 28) is a structure that is substantially the same as a so-called Lightly Doped Drain.

Furthermore, in the present exemplary embodiment, the first charge accumulating section 30 is provided on the first variable resistance region 26, and the second charge accumulating section 32 is provided on the second variable resistance region 28. The first and second charge accumulating sections (30, 32) are Oxide Nitride Oxide (ONO) layered insulating films. The ONO layered insulating films are structured from a silicon oxide film (first oxide layer) 301, a silicon nitride film (SiN) 303, and a silicon oxide film (second oxide film) 305, layered in sequence on the first and second variable resistance regions (26, 28), and having a stable charge accumulating capability.

Hot carrier injected from the above first and second variable resistance regions (26, 28) is mainly accumulated in the silicon nitride film 303 within the ONO layered insulating films. Note that the charge accumulating section can be appropriately selected according to the purpose and design of the memory being configured. For example, one, two, or more types of insulating film can be appropriately selected from a silicon nitride film, an aluminum oxide film ($Al_2O_3$), and/or a hafnium oxide ($HfO_x$) insulating film, as insulating film(s) disposed in a sandwich construction between a first and second oxide film, formed, for example, from silicon oxide film or the like.

In this exemplary configuration, since the first and second charge accumulating sections (30, 32) are each formed from above the first and second variable resistance regions (26, 28), respectively, up across to the top of the side walls of the gate electrode 24, accumulating and holding of injected charge is secured. Furthermore, by providing a variable resistance section and a charge accumulating section on both the source region 16 and the drain region 18 sides, separate individual writing of data is enabled to each of the first and second charge accumulating sections (30, 32).

Figure 2:
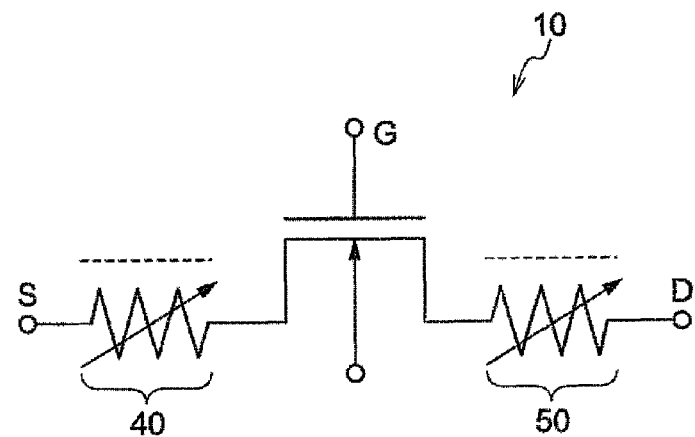
FIG. 2 is a circuit diagram showing an equivalent value circuit of a memory cell according to each exemplary embodiment.

Furthermore, since the first and second charge accumulating sections (30, 32) are formed, respectively, physically non-contiguous to each other, at both the outside side faces of the gate electrode 24, even if gate length is short due to continuing miniaturization, separate and independent accumulating and holding of charge can be made for each of the first and second charge accumulating sections (30, 32). An equivalent value circuit diagram is shown in FIG. 2 of the memory cell 10 configured as described above. As shown in FIG. 2, the memory cell 10, configuring a specific example of an n-MOSFET, is a circuit in which a first variable resistor 40 and a second variable resistor 50 are connected at both a source region (S) side and a drain region (D) side, respectively.

Data Writing, Reading, and Erasing Operations

An outline explanation follows of operations performed to the memory cell 10 when data writing, data reading, and data erasing, with reference to Table 1. Explanation follows, as an example, of cases where data writing, data reading and data erasing are performed to the drain region 18 side of the memory cell 10.

However, when performing similar operations to the source region 16 side, since similar operations can be performed by switching over the voltage between the source region and the drain region, further explanation thereof is omitted.

TABLE 1

| | Drain Region | Gate Region | Source Region |
|---|---|---|---|
| Writing | +Vdw | +Vgw | 0 |
| Reading | 0 or +Vdw | +Vgr | +Vsr |
| Erasing | +Vde | 0 or −Vge | +Vse |

Data Writing Method

Data writing operation to the memory cell 10 is performed, for example, by the following method. Explanation here is of a case where the initial state is a state in which no charge is accumulated in the charge accumulating section (equivalent to the logical state "11"), and data is written to the drain region 18 side to give data other than the logical state "11", namely data for one or other of "00", "01", and "10" (in this sequence the charge amount for accumulating increases). When data is being written to the drain region 18 side, a positive voltage (+Vgw) is applied to the drain region 18, a positive voltage (+Vgw) is applied to the gate electrode 24, and the source region 16 is connected to ground potential.

Under these conditions, field is concentrated at the periphery of the second variable resistance region 28 of lower concentration of n-type impurity than the drain region 18. Consequently, a hot carrier, this being hot electrons (also referred to as high energy electrons), is generated by collision ionization, and effectively concentrated in the second variable resistance region 28.

As a result, the hot electrons overcome the energy barrier from the second variable resistance region 28 to the first oxide layer 301, and data writing can be performed by selective injection into the second charge accumulating section 32. The voltage+Vdw is sufficient voltage to cause hot electron generation, and differs according to the application and design. Furthermore, the voltage+Vgw is a sufficient voltage to form sufficient carrier in the channel forming region 20, and also to inject hot electrons generated in the vicinity of the drain region 18 into the second charge accumulating section 32, and differs according to the application and design. Furthermore, the smaller the logical value of the data for writing, namely the smaller the read current value, the higher the voltage required for the voltage+Vgw.

Data Reading Method

Operation to read data of the drain region 18 side is performed by the following method.

When data is being read from the drain region 18 side, a positive voltage (+Vsr) is applied to the source region 16, a positive voltage (+Vgr) is applied to the gate electrode 24, and zero or a positive voltage (+Vdr) is applied to the drain region 18.

At the drain region 18 side, when charge (in this case electrons) is accumulated in the second charge accumulating section 32, the resistance of the second variable resistance region 28 rises as the accumulated charge amount increases. As a result thereof, a state is arrived at where carrier is not readily supplied to the channel forming region 20, and the current value flowing in the channel forming region 20 decreases.

However, when the drain region 18 side remains in the logical state "11", the initial state, since charge is not accumulated in the second charge accumulating section 32, the resistance of the second variable resistance region 28 does not change. As a result, carrier is supplied to the channel forming region 20, and sufficient current flows in the channel forming region 20.

Namely, by using differences in current values flowing in the n-MOSFET (read current values), discrimination can be made at to which data, from the logical values "00", "01", "10", and "11", is written to the drain region 18 side.

Data Recording (Erasing) Method

Erasing of data on the drain region 18 side is performed by the following method.

(a) When, for example, the memory cell 10 is employed as a One Time Programmable Read Only Memory (OTPROM), operation is completed by the above described writing operation, however erasing of written data is required during product quality testing.

In such cases, when one or other of logical values "00", "01" or "10" is written, in order to neutralize charge that is accumulated in the second charge accumulating section 32, irradiation of ultraviolet radiation or heat treatment (including leaving to stand in a high temperature environment) or the like, for example, may be performed to the second charge accumulating section 32 of the drain region 18 side. Memory configuration of reduced cost can be realized by such a method, since provision of a separate circuit for electrical erasure becomes unnecessary.

(b) However, for example, a configuration capable of electrically erasing data is possible, as in an Electrically Erasable and Programmable ROM (EEPROM). In such cases, when charging has been made with charge accumulated in the second charge accumulating section 32 (cases here where the logical values "00", "01", or "10" are written), a positive voltage (+Vde) is applied to the drain region 18, zero or a negative voltage (−Vge) is applied to the gate electrode 24, and a positive voltage (+Vse) is applied to the source region 16.

Due to such conditions, hot holes that are generated at the periphery of the drain region 18 are injected into the second charge accumulating section 32. As a result, erasure of data can be performed by neutralization of the charge (electrons in this case) that was accumulated in the second charge accumulating section 32. The +Vde here is a voltage sufficient to generate hot holes at the vicinity of the drain region 18, about 2V or greater, and is preferably about 4V to about 10V. The −Vge is a voltage for application to effectively concentrate the hot holes at the periphery of the second charge accumulating section 32, and may be about −7V to about 0V.

Configuration of Semiconductor Non-Volatile Memory

Figure 3:
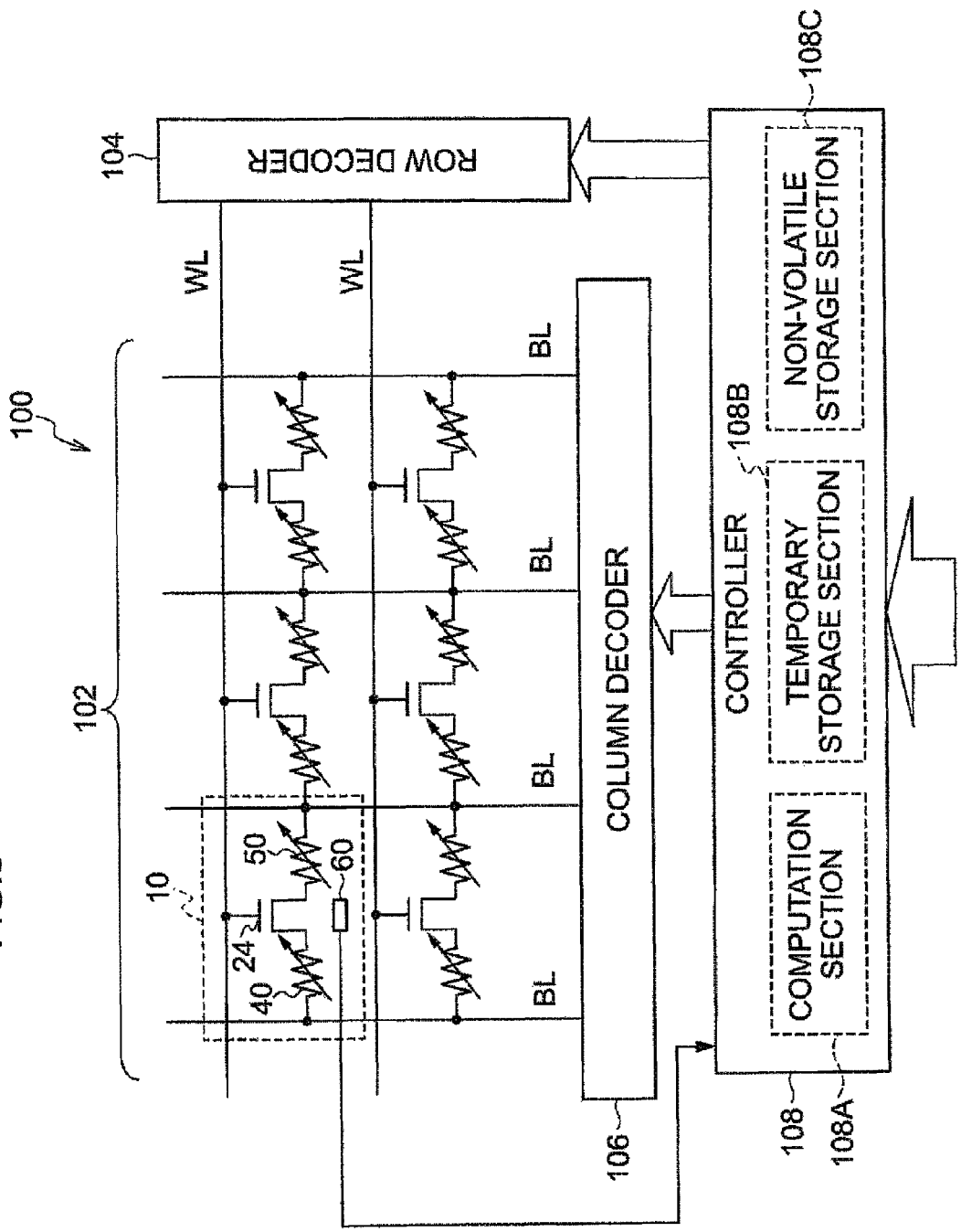
FIG. 3 is diagram showing a configuration of a semiconductor non-volatile member according to each exemplary embodiment.

Explanation follows of a configuration of a semiconductor non-volatile memory 100 according to the present exemplary embodiment, with reference to FIG. 3.

As shown in FIG. 3, the semiconductor non-volatile memory 100 is equipped with a memory cell array 102 provided with plural of the memory cells 10. Namely, memory cells 10 are provided in the memory cell array 102, an array of plural word lines WL provided in a first direction (row direction) intersecting with plural bit lines BL provided in a second direction (column direction) that intersects with the first direction, at the intersecting sections of each of the word lines WL with each of the bit lines BL.

The gate electrode 24 of each of the memory cells 10 is connected to one of the word lines WL. Furthermore, the source region 16 and the drain region 18 of each of the memory cells 10 are respectively connected to one of the bit lines BL.

Each of the word lines WL is connected to a row decoder 104, and each of the bit lines BL is connected to a column decoder 106. The row decoder 104 and the column decoder 106 are respectively connected to a controller 108 (control section). The row decoder 104 and the column decoder 106 configure the voltage application section.

In the controller 108 are provided: a computation section 108A that controls the writing and reading operations of data to the memory cell array 102; a temporary storage section 108B that temporarily stores data; and a non-volatile storage section 108C that stores various programs, such as, for example, a data writing program, described below, and the like. When input from outside with data the controller 108 executes the data writing program, and outputs to the row decoder 104 the 2-bit data subjected to storage, a row address expressing a row number of the word line WL to which the data storage destination memory cell 10 is connected, and instruction data relating to the voltage to be applied to the word line WL. The controller 108 also outputs, to the column decoder 106, a column address expressing the column numbers of the two bit lines BL to which the data storage destination memory cell 10 is connected, and instruction data relating to the voltage to be applied to the two bit lines BL.

The row decoder 104 controls the application of voltage to the word line WL according to the input 2-bit data, row address, and instruction data. The column decoder 106 controls the application of voltage to the bit lines BL according to the input column address and instruction data.

Note that in the present exemplary embodiment, each of the memory cells 10 is equipped with a current detector 60 that detects current flowing in the channel forming region (current path) between the source and the drain regions, and the detected values are input to the controller 108.

Operation of the Semiconductor Non-Volatile Memory

Explanation follows of the operation of the semiconductor non-volatile memory 100 of the present invention.

When input from outside with data to be written to each of the memory cells 10 of the memory cell array 102 (data configuring 4-bits in the present exemplary embodiment), and with the address data specifying the storage destination memory cell 10, the controller 108 first stores the data and address data in the temporary storage section 108B, and then executes the data writing program stored in the non-volatile storage section 108C.

The data writing program performs successive writing and reading to the first and second charge accumulating sections (30, 32) of each of the memory cell 10, and repeats writing and reading for each of the first and second charge accumulating sections (30, 32) until the desired read current value, or less is achieved.

Figure 4:
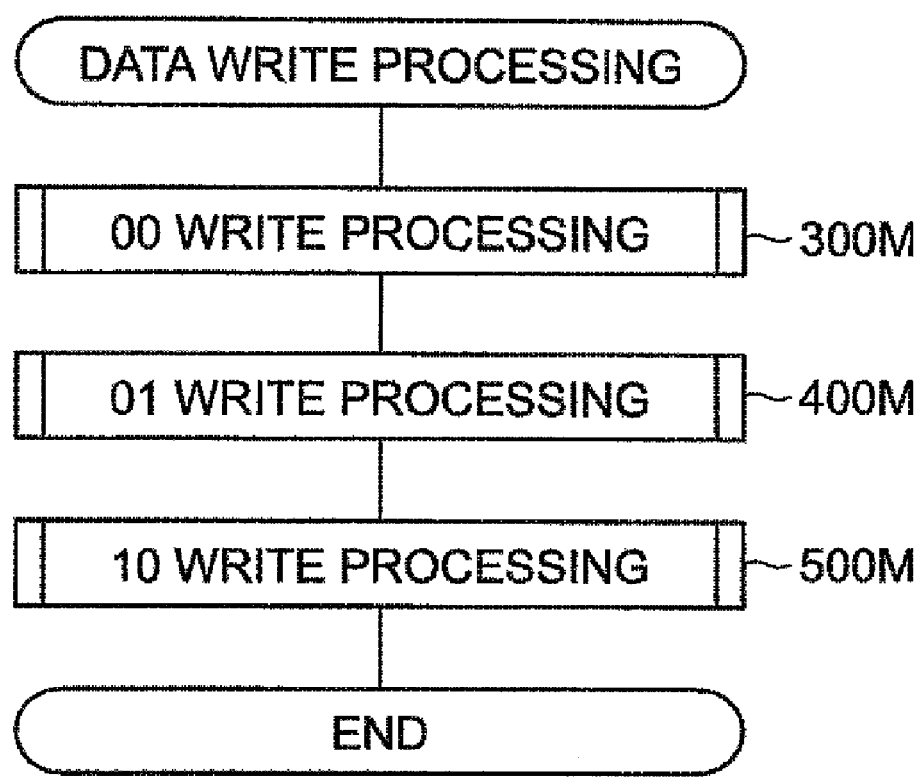
FIG. 4 is a flow chart showing process flow of a data writing program according to a first exemplary embodiment.

FIG. 4 is a flow chart showing process flow of the data writing program executed by the controller 108. Explanation follows of a specific process flow of the data writing program, with reference to FIG. 4.

Figure 15A:
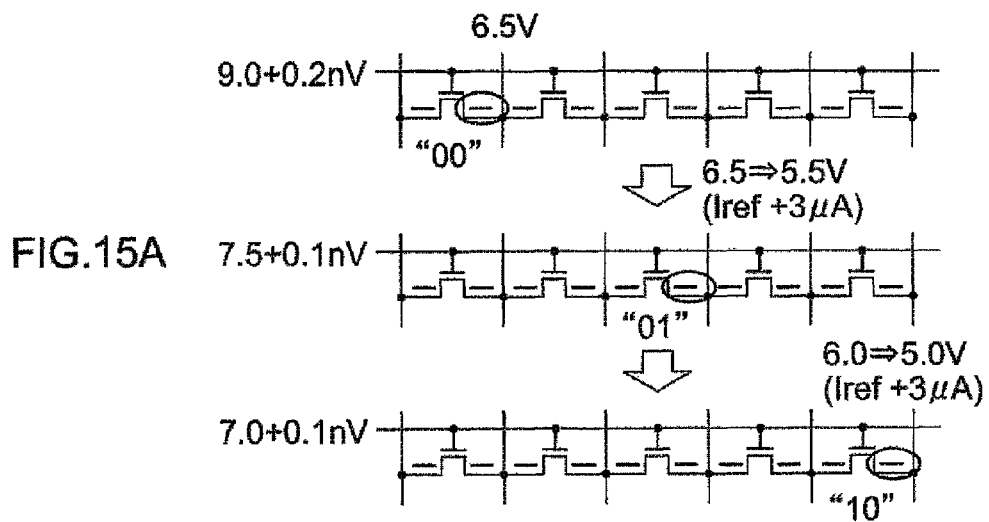
FIG. 15A is a diagram in which the sequence of writing of plural memory cells in the first exemplary embodiment is shown.

At step 300M in FIG. 4, write processing is executed for the 00 data having the greatest charge for accumulating, at step 400M write processing is executed for the 01 data having the next greatest charge for accumulating, and at step 500M write processing is executed for the 10 data having the least charge for accumulating. Namely, as shown in FIG. 15A, each of the respective plural memory cells for 00 data writing is written to in succession, each of the respective plural memory cells for 01 data writing is written to in succession, and then each of the respective plural memory cells for 10 data writing is written to in succession. The charge accumulating sections of the memory cells to which no charge is accumulated in the above processing are for 11 data.

Figure 5:
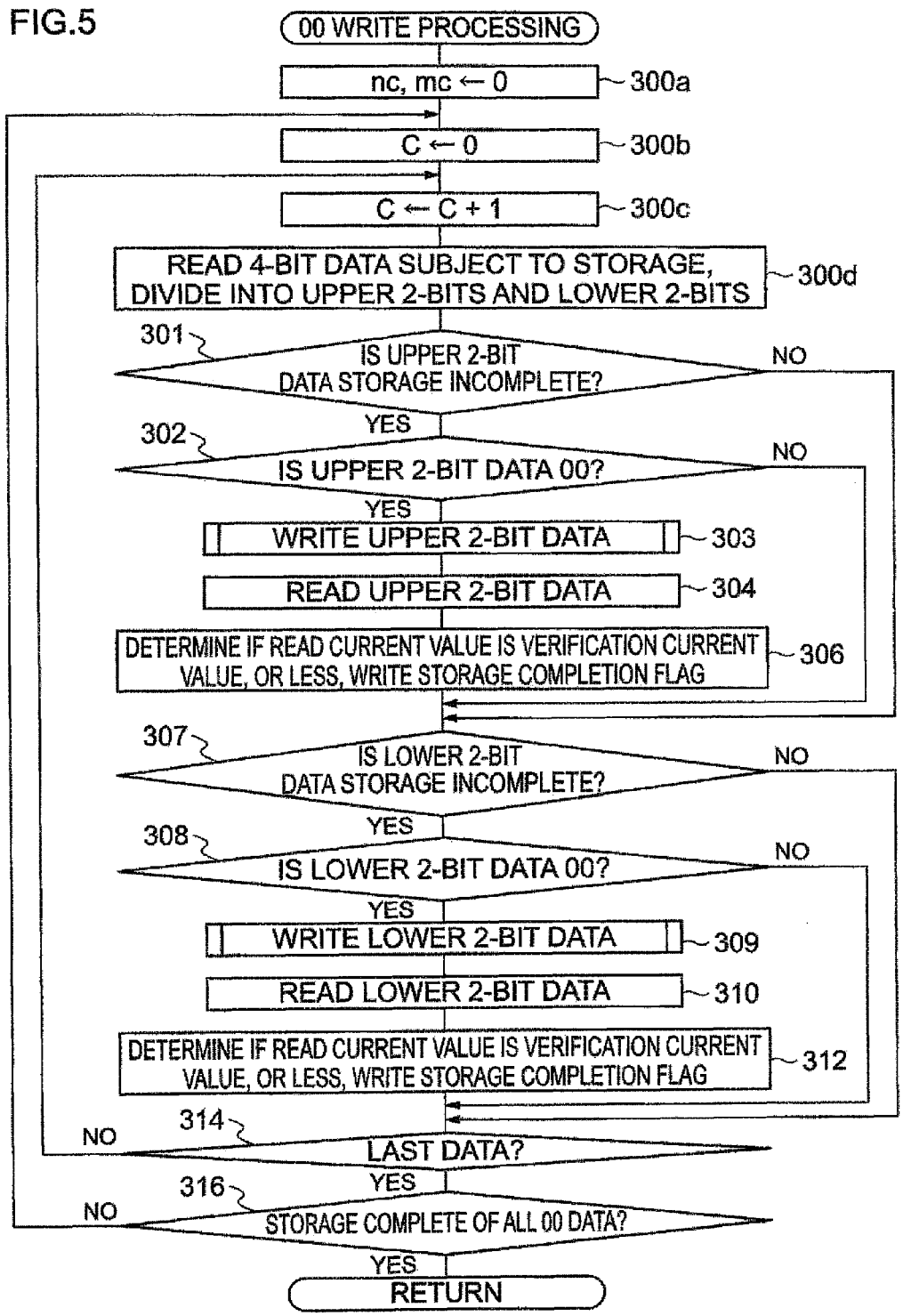
FIG. 5 is a flow chart showing process flow of a data writing program of 00 data of step 300M of FIG. 4.

A detailed explanation follows of the writing of 00 data at step 300M of FIG. 4, with reference to FIG. 5.

At step 300a, the present processing is employed, and variables $n_c$ and $m_c$, expressing the number of times of writing of the upper bit side and the lower bit side, respectively, are reset to 0, at step 300b, the variable c that identifies each of the memory cells is reset to 0, and at step 300c, the variable c is incremented by 1.

At step 300d, the 4-bit data to be stored in the memory cell identified by the variable c is read from the temporary storage section 108B, and the 4-bit data read is divided into upper 2-bit data and lower 2-bit data. The upper bits indicate the first charge accumulating section 30 side, and the lower bits indicate the second charge accumulating section 32 side. Namely, writing of the upper bit data indicates accumulating of charge in the first charge accumulating section 30, and writing of the lower bit data indicates accumulating of charge in the second charge accumulating section 32.

At the next step 301, in order to determine whether or not storage of the upper 2-bit data of the memory cell identified by the variable c has been completed in the memory cell 10 of the intended address, a storage completion flag relating to the upper 2-bit data subject to storage is read from the temporary storage section 108B. When the storage completion flag is 1 (incomplete storage) then processing proceeds to step 302, and when the storage completion flag is 0 (storage complete), processing proceeds to step 307. Note that the initial value of the storage completion flag is 1 (incomplete storage) (this also applies below in the present exemplary embodiment).

At the next step 302, determination is made as to whether or not the upper 2-bit data subject to storage is "00" data, or data other than "00" data ("01", "10", "11"). When the upper 2-bit data subject to storage is data other than "00" data, since writing is not required at this stage, processing proceeds to straight to step 307. However, when the upper 2-bit data subject to storage is "00" data, processing proceeds to step 303.

At the next step 303, the write processing of the upper 2-bit data (in this case "00" data) is executed. Namely, the upper 2-bit data (in this case "00" data), the row address expressing the row number of the memory cell 10 identified by the variable c, and the instruction data, relating to the voltage to be applied to the word line WL, is output to the row decoder 104. The column address, expressing the column number of the data storage destination memory cell 10, and the instruction data instructing voltage to be supplied to the bit line BL connected to the source region 16, is output to the column decoder 106. The specific content thereof is described below.

At the next step 304, the row address expressing the row number of the memory cell 10 that is the data storage destination for the writing of step 303, and the instruction data relating to the voltage to be applied to the word line WL is output to the row decoder 104. The column address, expressing the column number of the data storage destination memory cell 10 for writing of step 303, and instruction data that instructs supply of 0 or a positive voltage to the bit line BL connected to the source region 16, is output to the column decoder 106.

The row decoder 104 applies a positive voltage (+Vgr), described below, to the word line WL designated by the row address.

The column decoder 106 applies 0 or a positive voltage (+Vdr) to the bit line BL connected to the drain region 18 of the column number designated by the column address, and also applies a positive voltage (+Vsr), described below, to the bit line BL connected to the source region 16.

Due thereto, since the drain region 18 of the designated memory cell 10 gets connected to ground potential or is applied with the positive voltage (+Vdr), the positive voltage (+Vgr) is applied to the gate electrode 24, and the positive voltage (+Vsr) is applied to the source region 16, a current flows between the drain region 18 and the source region 16 of the memory cell 10. This current is read by the current detector 60.

At the next step 306, this read current value is compared to see whether or not it is a specific verification current value (for example 10.0 μA) that is in accordance with the data subject to writing at step 303 ("00" data here), or less. When the read current value is the verification current value, or less, then determination is made that storage of data to the charge accumulating section is complete, and address data of this data is stored in the temporary storage section 108B together with the storage completion flag of 0 (storage complete). However, if the read current value is greater than the verification current value, then determination is made that data storage to the charge accumulating section is incomplete, and the address data of this data is stored in the temporary storage section 108B together with a storage completion flag of 1 (incomplete storage).

In the next step 307, in order to determine whether or not storing of the lower 2-bit data has been completed in the desired memory cell 10 identified as subject to storage by the variable c, the storage completion flag relating to the lower 2-bit data subject to storage is read from the temporary storage section 108B. When the storage completion flag is 1 (incomplete storage) then processing proceeds straight to step 308, and when the storage completion flag is 0 (storage complete) then processing proceeds to step 314.

At the next step 308, determination is made as to whether or not the lower 2-bit data subject to storage is "00" data or data other than "00" data ("01", "10", "11"). When the lower 2-bit data subject to storage is data other than "00" data, since writing is not required at this stage, processing proceeds straight to step 314. However, when the lower 2-bit data subject to storage is "00" data, processing proceeds to step 309.

At the next step 309, the lower bit data is written. Namely, the lower 2-bit data ("00" data in this case), the row address expressing the row number of the memory cell 10 that is the data storage destination, and the instruction data relating to the voltage to be applied to the word line WL is output to the row decoder 104. The column address expressing the column number of the data storage destination memory cell 10, and instruction data instructing the bit line BL connected to the source region 16 to be connected to ground potential, is output to the column decoder 106. Details thereof are described below.

At the next step 310, the row address, expressing the row number of the memory cell 10 of the data storage destination for writing at step 308 and the instruction data relating to the voltage that was applied to the word line WL is output to the row decoder 104. The column address expressing the column number of the data storage destination memory cell 10 of writing at step 309, and instruction data instructing voltage to be supplied to the bit line BL connected to the source region 16 is output to the column decoder 106.

The row decoder 104 applies a positive voltage (+Vgr) to the word line WL of the row number designated by the row address.

The column decoder 106 applies a positive voltage (+Vdr) to the bit line BL connected to the drain region 18 of the column number designated by the column address, and applies either 0 or a positive voltage (+Vsr) to a source line SL.

Due thereto, the potential of the source region 16 of the designated memory cell 10 becomes the positive voltage (+Vsr), the positive voltage (+Vgr) is applied to the gate electrode 24, and since the drain region 18 is connected to the ground potential or becomes the positive voltage (+Vdr), a current flows between the source region 16 and the drain region 18 of the memory cell 10. This current is read by the current detector 60.

At the next step 312, the read current value is compared to see whether or not it is a specific verification current value according to the data subject to writing at step 309, or less. When the read current value is the verification current value (10.0 μA, the same as above), or less, then determination is made that storage of data to the charge accumulating section is complete, and address data of this data is stored in the temporary storage section 108B together with the storage completion flag of 0 (storage complete). However, if the read current value is greater than the verification current value, then determination is made that data storage to the charge accumulating section is incomplete, and the address data of this data is stored in the temporary storage section 108B together with a storage completion flag of 1 (incomplete storage).

At the next step 314, determination is made as to whether or not the variable c is now the number of total memory cells, namely the last memory cell. When not the last memory cell, processing returns to step 300c since there is still a possibility that there are other memory cell(s) to which 00 data has not yet been written, and the above processing (step 300c to step 314) is repeated. However, when it is the last memory cell, processing proceeds to step 316.

At the next step 316, determination is made as to whether or not the storage completion flags, for all of the "00" data in the data subject to storage in the memory cell array 102, are 0 (storage complete), and even if only one of them is 1 (incomplete storage) then processing returns to step 300b, and the above processing (step 300b to step 316) is repeated. However, if the storage completion flags are all 0, then processing proceeds to step 400M.

Figure 6:
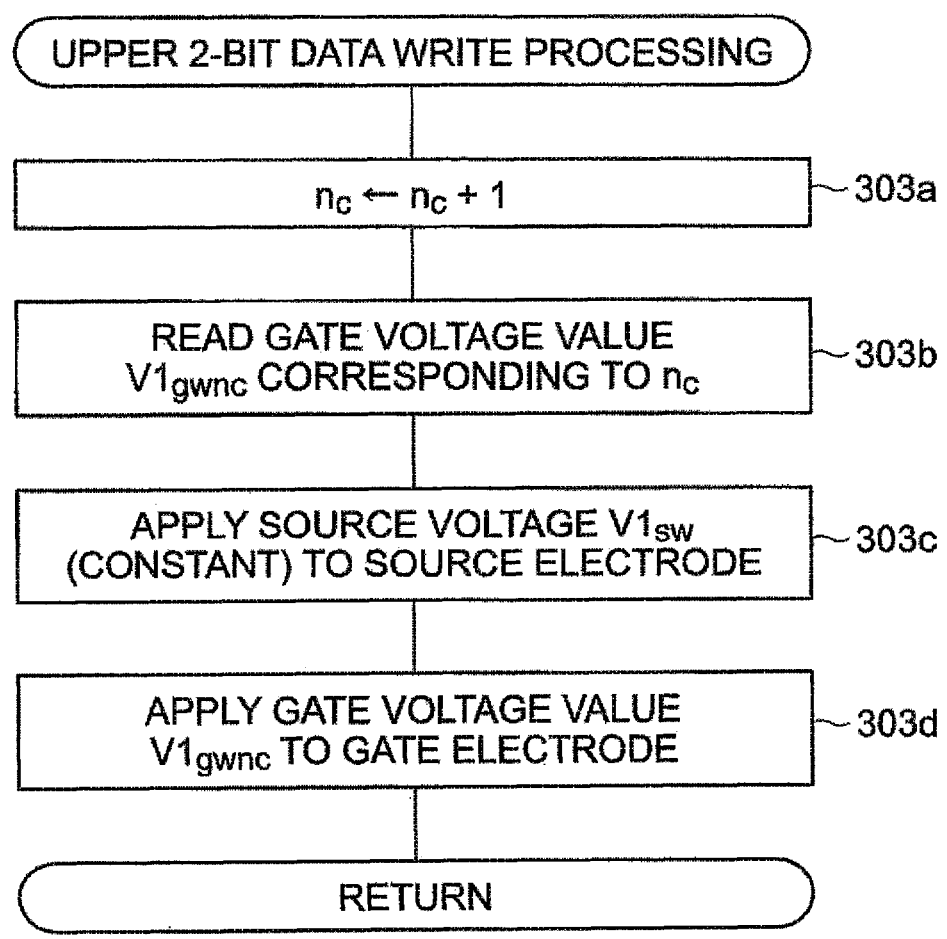
FIG. 6 is a flow chart showing process flow of a data writing program of upper 2-bit data of step 303 of FIG. 5.

Detailed explanation follows of write processing of upper bit data (first charge accumulating section 30) of step 303 of FIG. 5, with reference to FIG. 6.

At step 303a, count value $n_c$, for counting the number of times of writing for the upper bit of the memory cell identified by variable c, is incremented by 1. At step 303b, the gate voltage value $V1_{gwnc}$ corresponding to the count value $n_c$ of the number of times of writing for the memory cell identified by the variable c at step 303b is read out.

Explanation follows regarding the gate voltage value $V1_{gwnc}$. As shown at the left hand side of FIG. 15B, in the present exemplary embodiment, the gate voltage value $V1_{gwnc}$ initially starts at 9.0V, and as the number of times of writing increases, gate voltage value $V1_{gwnc}$ is increased by 0.2V at a time until it becomes 10.0V, at which point it remains a constant 10.0V. Consequently, in the present exemplary embodiment, the storage is made that maps the relationship of the left hand side of FIG. 15B.

Figure 15B:
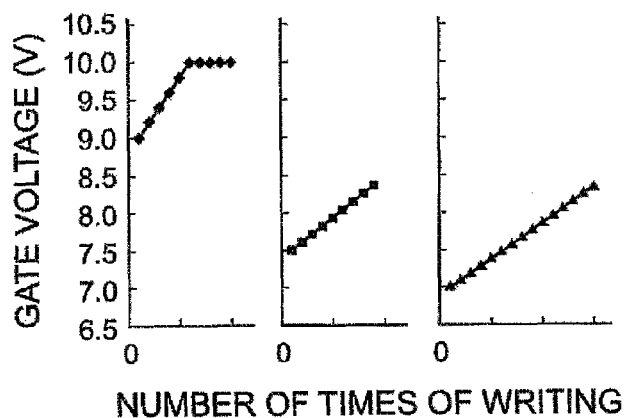
FIG. 15B is a graph showing the gate electrode being gradually increased along with an increase in the number of times of writing.

In the present step 303b, the gate voltage value $V1_{gwnc}$ corresponding to the count value $n_c$ of the number of times of writing for the memory cell identified by the variable c is read from the above map (FIG. 15B left hand side).

Figure 15C:
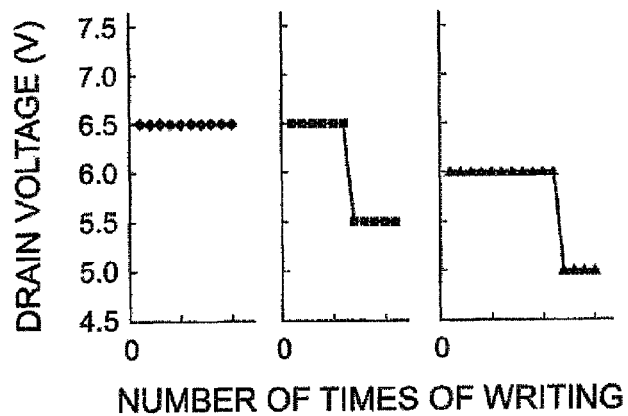
FIG. 15C is a graph showing the drain voltage being constant when writing 00 data, and being reduced stepwise once as the number of times of writing increases when writing 01 data and 10 data.

However, in the present exemplary embodiment, as shown at the left hand side of FIG. 15C, the drain voltage stays a constant 6.5V even though the above number of times of writing increases. This is also similar for the source voltage $V1_{sw}$.

Figure 14A:
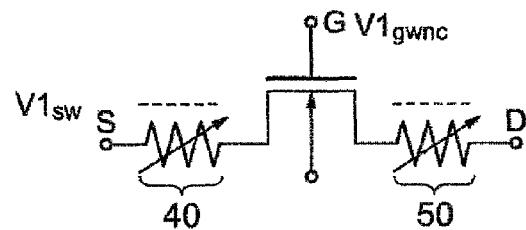
FIGS. 14A to 14F are diagrams showing states of voltage application to a gate electrode, source electrode and drain electrode during processing of a data writing program in the first exemplary embodiment.

At step 303c, as shown in FIG. 14A, the source voltage $V1_{sw}$ is applied to the source electrode 6, and at step 303d, the gate voltage value $V1_{gwnc}$ is applied to the gate electrode 24.

Namely, the row decoder 104 applies the gate voltage value $V1_{gwnc}$, which is in accordance with the upper 2-bit data to the word line WL designated by the row address, for a specific write duration. The column decoder 106 connects the bit line BL connected to the drain region 18 of the column number designated by the column address to ground, and applies the source voltage $V1_{sw}$ to the bit line BL connected to the source region 16 for a specific write duration. Due thereto, a charge of a fixed amount is accumulated in the first charge accumulating section 30 of the memory cell 10.

Figure 7:
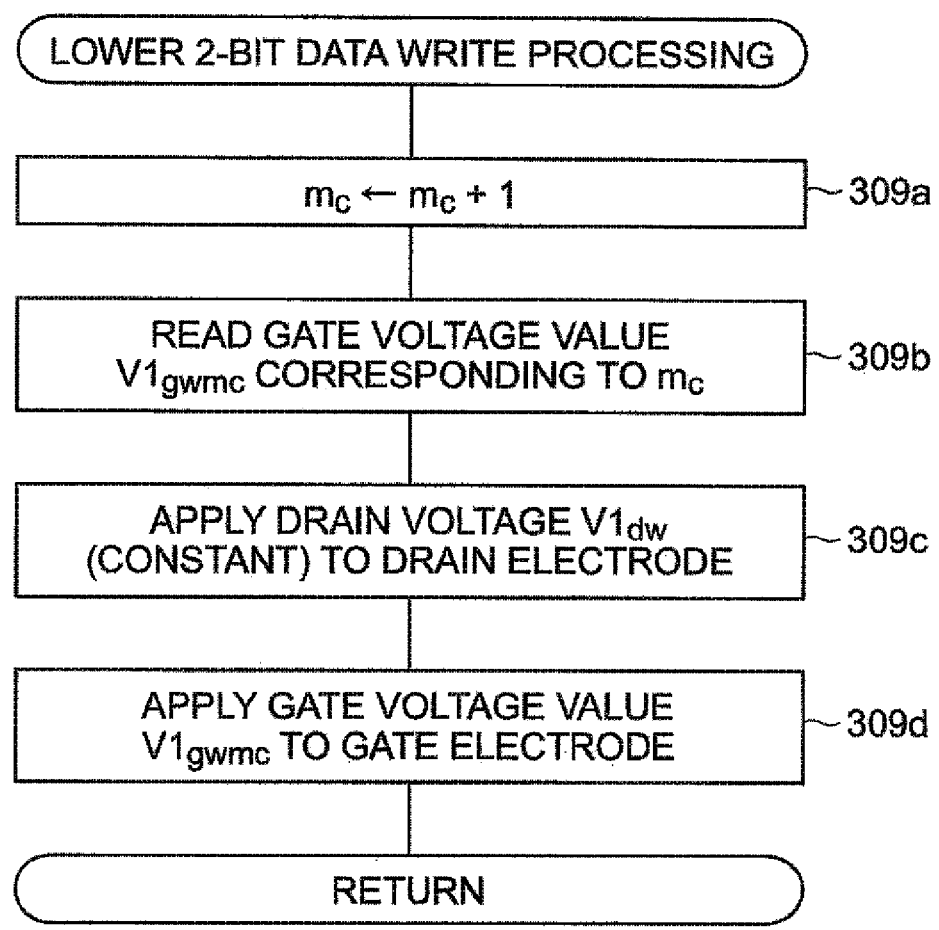
FIG. 7 is a flow chart showing process flow of a data writing program of lower 2-bit data of step 309 of FIG. 5.

Next, detailed explanation follows of write processing of lower bit data of step 309 of FIG. 5 (second charge accumulating section 32), with reference to FIG. 7.

At step 309a, the count value $m_c$ for counting the number of times of writing for the lower bit of the memory cell identified by the variable c is incremented by 1. At step 309c, the gate voltage value $V1_{gwmc}$ corresponding to the count value $m_c$ of the number of times of writing for the memory cell identified by the variable c is read out.

Since the gate voltage value $V1_{gwmc}$ is similar to above gate voltage value $V1_{gwnc}$, further explanation thereof will be omitted. Drain voltage $V1_{dw}$ is similar to source voltage $V1_{sw}$ (see left hand side of FIG. 15C).

Figure 14B:
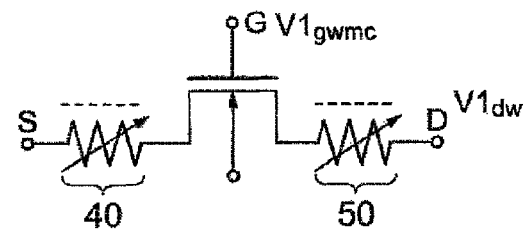

At step 309c, as shown in FIG. 14B, the drain voltage $V1_{dw}$ is applied to the drain electrode 18, and at step 309d, the gate voltage value $V1_{gwmc}$ is applied to the gate electrode 24.

Figure 8:
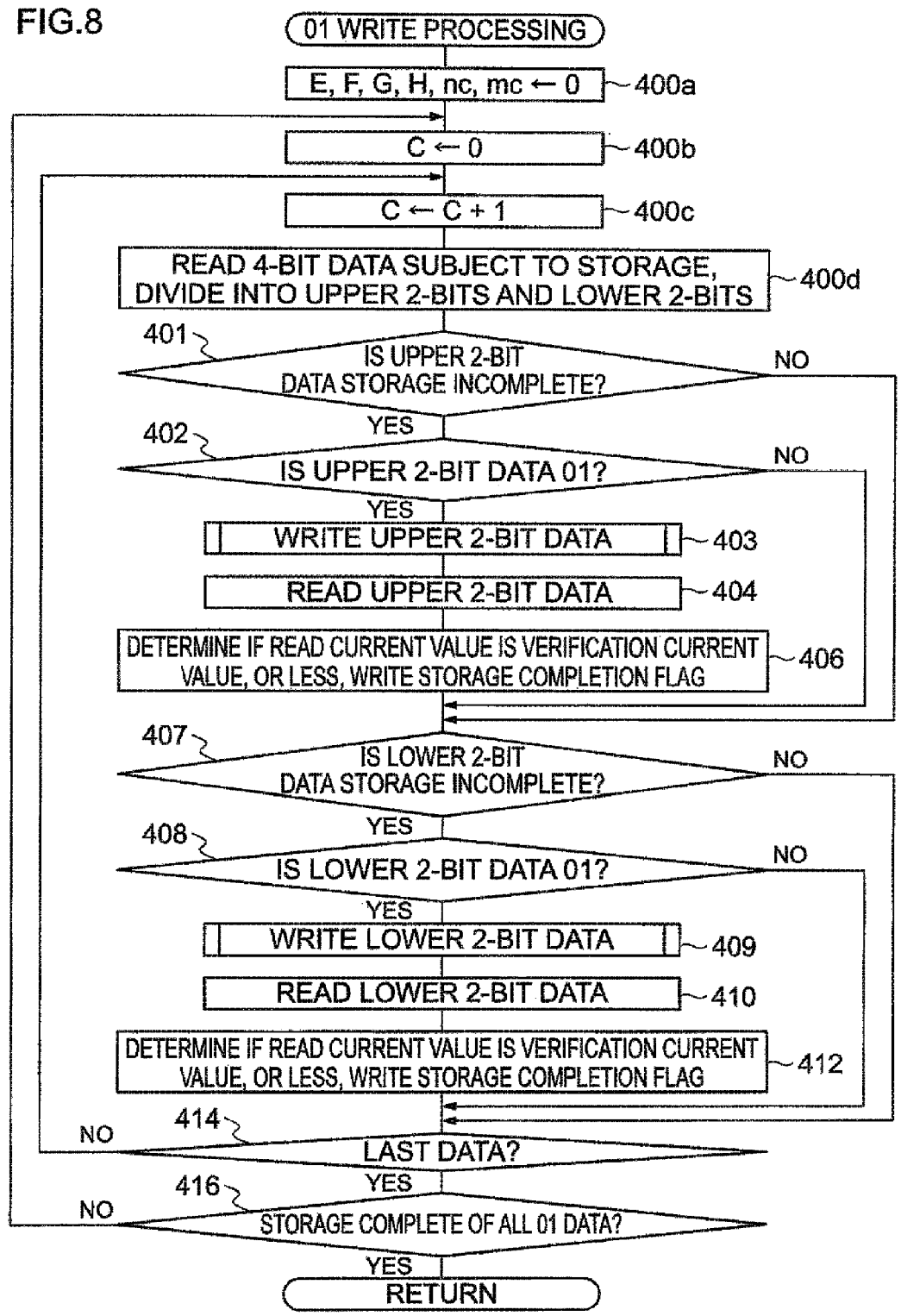
FIG. 8 is a flow chart showing process flow of a data writing program of 01 data of step 400M of FIG. 4.

Detailed explanation follows of the write processing of 01 data of step 400M of FIG. 4, with reference to FIG. 8.

At step 400a, the flags E, F, G, and H and the variables $n_c$ and $m_c$, employed in the current processing, are reset to 0, and at step 400b, the variable c that identifies each of the memory cells is reset to 0, and at step 400c, the variable c is incremented by 1.

At step 400d, the 4-bit data stored for the memory cell identified by the variable c is read from the temporary storage section 108B, and the 4-bit data read is divided into upper 2-bit data and lower 2-bit data.

At the next step 401, in order to determine whether or not storage of the upper 2-bit data of the memory cell identified by the variable c is complete at the memory cell 10 of the intended address, the storage completion flag relating to the upper 2-bit data subject to storage is read from the temporary storage section 108B. When the storage completion flag is 1 (incomplete storage) then processing proceeds to step 402, and when the storage completion flag is 0 (storage complete), processing proceeds to step 407.

At the next step 402, determination is made as to whether or not the upper 2-bit data subject to storage is 01 data. When the upper 2-bit data subject to storage is data other than 01 data, since writing is not required at this stage, processing proceeds straight to step 407. When the upper 2-bit data subject to storage is 01 data, however, processing proceeds to step 403.

At the next step 403, the write processing of the upper 2-bit data (in this case 01 data) is executed. The specific content thereof is described below.

At the next step 404, current flowing between the drain region 18 and the source region 16 of the memory cell 10 is read with the current detector 60.

At the next step 406, this read current value is compared to see whether or not it is a specific verification current value (for example 19.0 μA) that is in accordance with the data subject to writing at step 403 (in this case 01 data), or less. When the read current value is the verification current value, or less, then determination is made that storage of data to the charge accumulating section is complete, and address data of this data is stored in the temporary storage section 108B together with the storage completion flag of 0 (storage complete). However, if the read current value is greater than the verification current value, then determination is made that data storage to the charge accumulating section is incomplete, and the address data of this data is stored in the temporary storage section 108B together with the storage completion flag of 1 (incomplete storage).

At the next step 407, in order to determine whether or not storage of the lower 2-bit data of the memory cell identified by the variable c is complete at the memory cell 10 of the intended address, the storage completion flag relating to the lower 2-bit data subject to storage is read from the temporary storage section 108B. When the storage completion flag is 1 (incomplete storage) then processing proceeds to step 408, and when the storage completion flag is 0 (storage complete), processing proceeds to step 414.

At the next step 408, determination is made as to whether or not the lower 2-bit data subject to storage is 01 data. When the lower 2-bit data subject to storage is data other than 01 data, since writing is not required at this stage, processing proceeds straight to step 414. When the lower 2-bit data subject to storage is 01 data, however, processing proceeds to step 409.

At the next step 409, the write processing of the lower 2-bit data is executed. Details are described below.

At the next step 410, current flowing between the source region 16 and the drain region 18 of the memory cell 10 is read with the current detector 60.

At the next step 412, this read current value is compared to see whether or not it is a specific verification current value (19.0 μA, the same as above) that is in accordance with the data subject to writing at step 409, or less. When the read current value is the verification current value, or less, then determination is made that storage of data to the charge accumulating section is complete, and address data of this data is stored in the temporary storage section 108B together with the storage completion flag of 0 (storage complete). However, if the read current value is greater than the verification current value, then determination is made that data storage to the charge accumulating section is incomplete, and the address data of this data is stored in the temporary storage section 108B together with the storage completion flag of 1 (incomplete storage).

At the next step 414, determination is made as to whether or not the variable c is now the number of total memory cells, namely the last memory cell. When the variable c is not the last memory cell processing returns to step 400c, and the above processing (step 400c to step 414) is repeated. However, when it is the last memory cell, processing proceeds to step 416.

At the next step 416, determination is made as to whether or not the storage completion flags for all of the 01 data in the data subject to storage in the memory cell array 102 are 0 (storage complete), and even if only one of them is 1 (incomplete storage) then processing returns to step 400b, and if the storage completion flags are all 0, then processing proceeds to step 500M.

Figure 9:
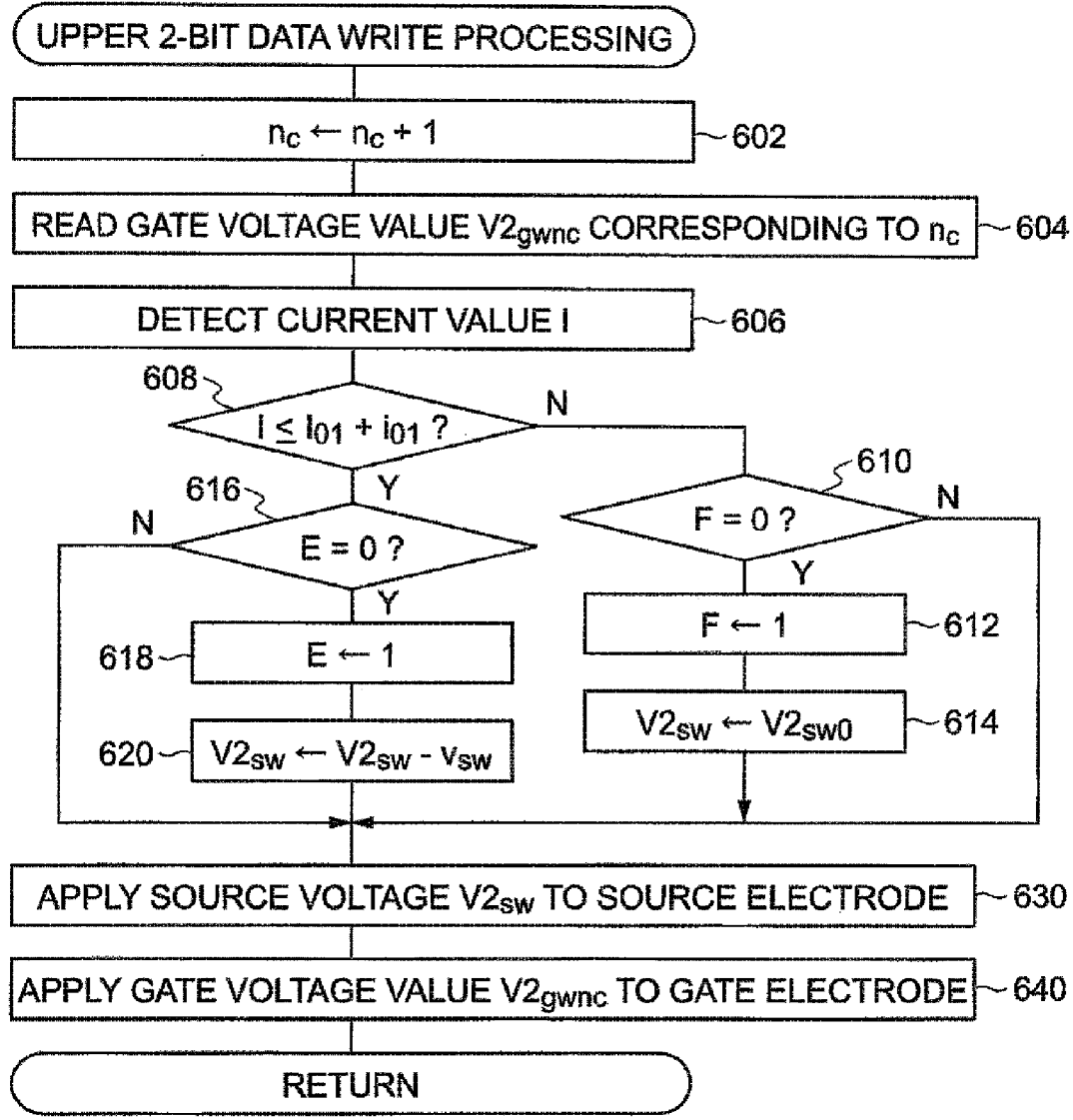
FIG. 9 is a flow chart showing process flow of a data writing program of upper 2-bit data of step 403 of FIG. 8.

Detailed explanation follows of write processing of upper bit data of step 403 of FIG. 8, with reference to FIG. 9.

At step 602, count value $n_c$, for counting the number of times of writing for the upper bit of the memory cell identified by variable c, is incremented by 1. At step 602, the gate voltage value $V2_{gwnc}$ corresponding to the count value $n_c$ of the number of times of writing for the memory cell identified by the variable c at step 602 is read out.

Explanation follows regarding the gate voltage value $V2_{gwnc}$. As shown in the center of FIG. 15B, in the present exemplary embodiment, the gate voltage value $V2_{gwnc}$ starts initially at 7.5V, and is increased as the number of times of writing increases, by 0.1V at a time. Consequently, in the present exemplary embodiment, storage is made that maps the relationship at the center of FIG. 15B.

At the current step 604, the gate voltage value $V2_{gwnc}$ corresponding to the count value $n_c$ of the number of times of writing for the memory cell identified by the variable c is read from the above map (FIG. 15B).

However, in the present exemplary embodiment, as shown in the center of FIG. 15C, the drain voltage (the source voltage too) is initially a constant 6.5V, even though the above number of times of writing increases. However, when the drain current, the value I of current flowing in the channel region, has become a value corresponding to the amount of charge accumulated in the first charge accumulating section 30 for 01 data, in a region where the current flowing in the channel region is greater than a predetermined target value (verification current value) $I_{01}$, then as the current value I approaches to the target value $I_{01}$ (when it becomes a value greater than the specific amount $I_{01}$ by specific amount $i_{01}$ (for example, 3.0 μA)), then the rate of increase of accumulating amount of charge, per time, is decreased once.

The charge accumulating amount changes here according to the applied state of voltage applied to the gate electrode and the source region. Changes, for example, according to the magnitude of voltage applied and the application duration. Hence, in order to reduce the rate of increase in the charge accumulating amount per time, at least one of the magnitude of the voltage and/or the application duration of the voltage may be made smaller.

Here, in the present exemplary embodiment, as shown in the center of FIG. 15C, the source voltage is lowered, for example, from 6.5V by a specific value, for example, by 1.0V to 5.5V.

In order to execute the above processing, first, at step 606, the current value I is detected as described above, at step 608, determination is made as to whether or not the current value I has got near to the target value $I_{01}$ (become $I_{01}+i_{01}$, or less).

At the first stage voltage is applied, the charge accumulating amount of the first charge accumulating section 30 is not so great, consequently, since the current flowing in the channel current region still large, determination is not made that the current value I is $I_{01}+i_{01}$, or less. Namely, negative determination is made at step 608, and at step 610 determination is made as to whether or not the flag F that is 0 (initial state) when write processing has not yet been performed for the upper bits of 01 data, is 0. When this determination is affirmative, at step 612, flag F is set to 1, at step 614, $V2_{sw0}$ (6.5V) is set as the source voltage $V2_{sw}$ for application to the source electrode 16.

Figure 14C:
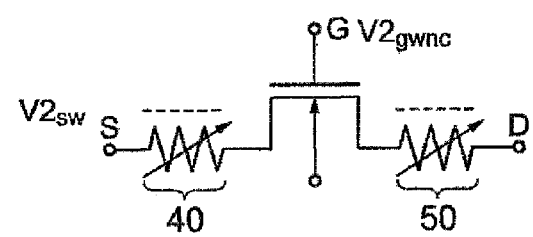

Then, as shown in FIG. 14C, at step 630, the source voltage $V2_{sw}$ is applied to the source electrode 16, and the gate voltage value $V2_{gwmc}$ is applied to the gate electrode 24.

When data is written to the memory cell 10 identified by the variable c for the second time onwards, when it is determined that the current value I is still not $I_{01}+i_{01}$, or less, determination at step 610 is negative, and the source voltage $V2_{sw}$ is maintained as it is at $V2_{sw0}$ (6.5V).

When the above writing is carried out a number of times, the current value I is then determined to be $I_{01}+i_{01}$, or less. When the current value I is initially determined to be $I_{01}+i_{01}$, or less, determination at step 616 is affirmative (determination is made as to whether or not a flag E that indicates when the current value I is first determined to be $I_{01}+i_{01}$, or less, is 0 (initial state)). Then, at step 618, flag E is set to 1, and at step 620 the present source voltage $V2_{sw}$ ($V2_{sw0}$ (6.5V)) is lowered by a specific value $v_{sw}$ (for example, the same as the above, 1.0V) to a lowered value (5.5V), and this is set as the source voltage $V2_{sw}$. After this, determination is negative at 616 even if determination is affirmative at step 608, and since step 620 is skipped, the source voltage $V2_{sw}$ is maintained without further change at $V2_{sw0}-v_{sw}$ (center of FIG. 15C).

Figure 10:
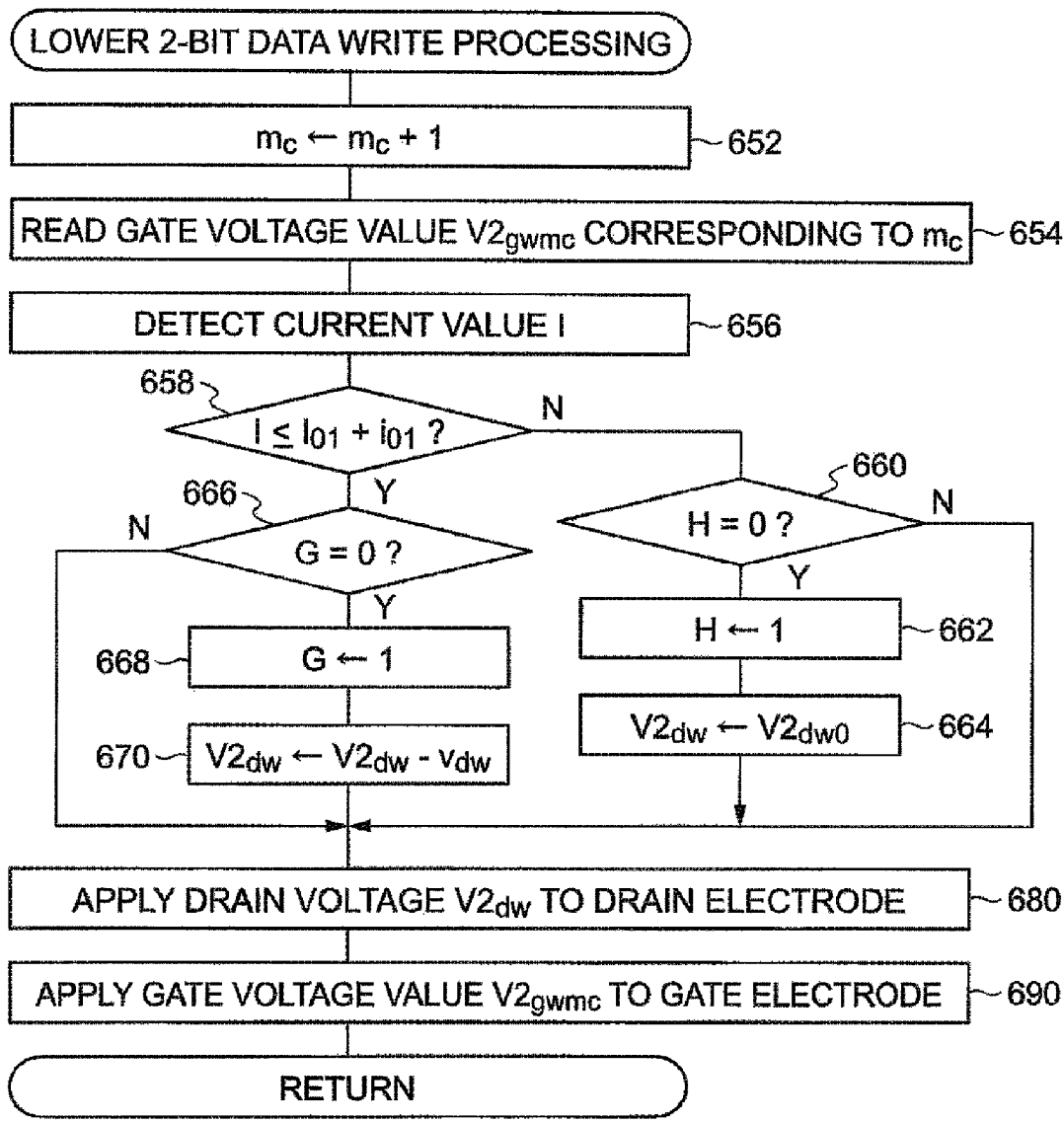
FIG. 10 is a flow chart showing process flow of a data writing program of lower 2-bit data of step 409 of FIG. 8.

Next, as shown in FIG. 10, detailed explanation follows of the write processing of lower bit data of step 409 of FIG. 8.

At step 652, the count value $m_c$, for counting the number of times of writing for the lower bits of the memory cell identified by the variable c, is incremented by 1. At step 652, the gate voltage value $V2_{gwmc}$ corresponding to the count value $m_c$ of the number of times of writing for the memory cell identified by the variable c is read (in a similar manner to above gate voltage value $V2_{gwnc}$.

In the lower 2-bit data write processing, in step 656 to step 690, similar to the write processing of the above upper 2-bit write processing (step 606 to step 640), when the current value I flowing in the channel region becomes a value corresponding to the amount of charge accumulated in the second charge accumulating section 32 for 01 data, in a region where the current flowing in the channel region is greater than the predetermined target value $I_{01}$, as the current value I approaches to the target value $I_{01}$ (when it becomes a value greater than $I_{01}$ by the specific amount $i_{01}$) then the rate of increase in charge accumulating amount per time is decreased once. Namely, as described above, since the rate of increase in charge accumulating amount per time is decreased, as shown in the center of FIG. 15C, the drain voltage is lowered by a specific value from 6.5V, for example by 1.0V, to become 5.5V. Note that the gate voltage, as shown in the center of FIG. 15B, starts from 7.5V and is increased by 0.1V as the number of times of writing increases.

Figure 14D:
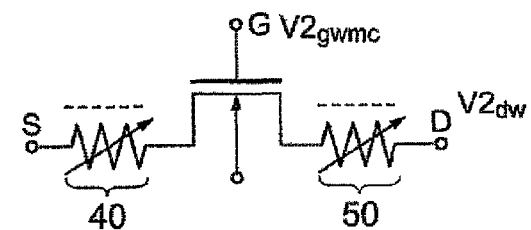

Then, at step 680 and step 690, the gate voltage value $V2_{gwmc}$ and drain voltage $V2_{dw}$ determined as described above are applied, as shown in FIG. 14D, to the gate electrode 24 and the source electrode 16.

Figure 11:
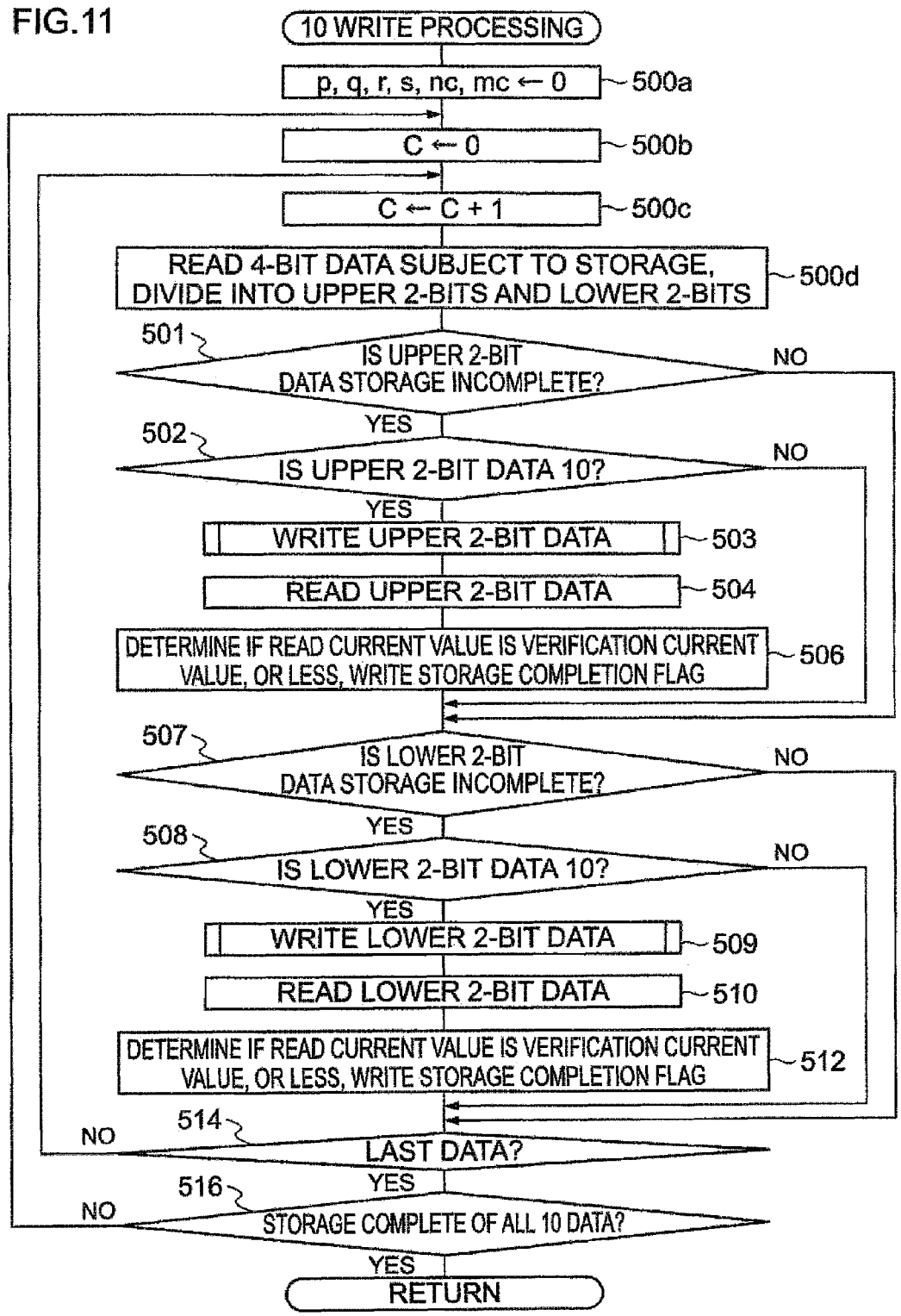
FIG. 11 is a flow chart showing process flow of a data writing program of 10 data of step 500M of FIG. 4.

Detailed explanation follows of write processing of 10 data of step 500M of FIG. 4, with reference to FIG. 11.

Since the write processing of 10 data of current step 500M (FIG. 11) is similar to the write processing of 01 data shown in FIG. 8, a detailed explanation is abbreviated. However, at step 502 determination is made as to whether or not the upper 2-bit data is 10 data, when this is a positive determination, the upper 2-bit data (10 data) is written at step 503. Furthermore, at step 508, determination is made as to whether or not the lower 2-bit data is 10 data, and when this determination is positive, the lower 2-bit data (10 data) is written at step 509.

Figure 12:
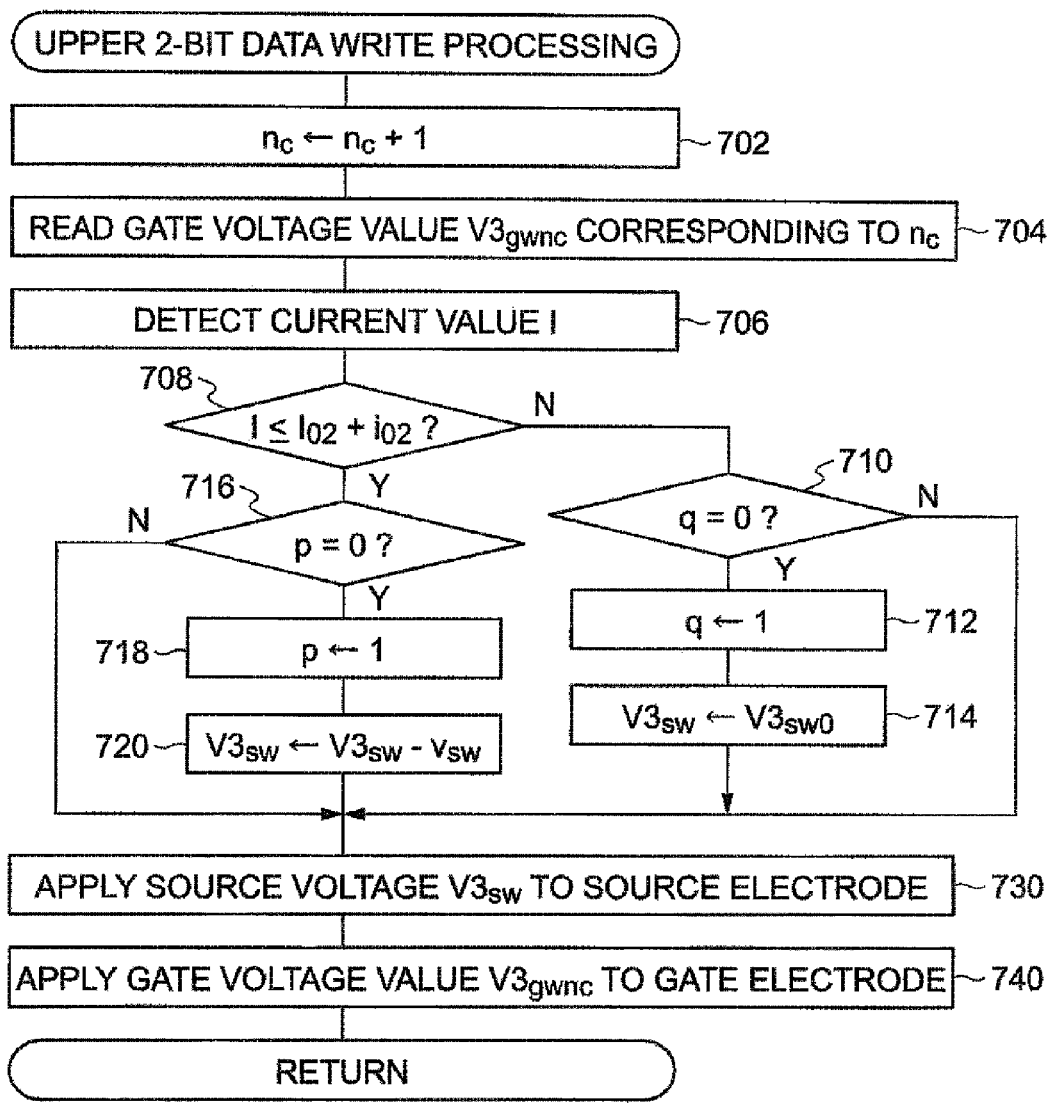
FIG. 12 is a flow chart showing process flow of a data writing program of upper 2-bit data of step 503 of FIG. 11.

Detailed explanation follows of writing of the upper bit data of step 503 of FIG. 11, with reference to FIG. 12.

Since the write processing of the upper bit data of the current step is also similar to the write processing of the upper bit data shown in FIG. 9, a detailed explanation is abbreviated. However, in the current processing too, when the value I of current flowing in the channel region becomes a value corresponding to the amount of charge accumulated in the first charge accumulating section 30 for 10 data, in a region where the current flowing in the channel region is greater than the predetermined target value $I_{02}$ (for example, 28.0 μA), as the current value I approaches to the target value $I_{02}$ (when it becomes a value greater than $I_{02}$ by the specific amount $i_{02}$ (for example, 3.0 μA) then the rate of increase in charge accumulating amount per time is decreased once. Namely, as described above, since the rate of increase in charge accumulating amount per time is decreased, as shown at the right hand side of FIG. 15C, the source voltage drops by a specific value from 6.0V, for example by 1.0V, to become 5.0V. Note that the gate voltage, as shown at the right hand side of FIG. 15B, starts from 7.0V and is increased by 0.1V as the number of times of writing increases.

Figure 14E:
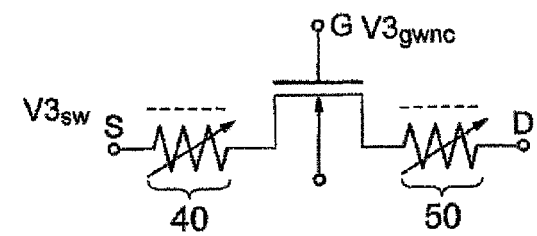

Then, in step 730 and step 740, the gate voltage value $V3_{gwnc}$ determined as described above and source voltage $V3_{sw}$ are applied, as shown in FIG. 14E, to the gate electrode 24 and the source electrode 16.

Figure 13:
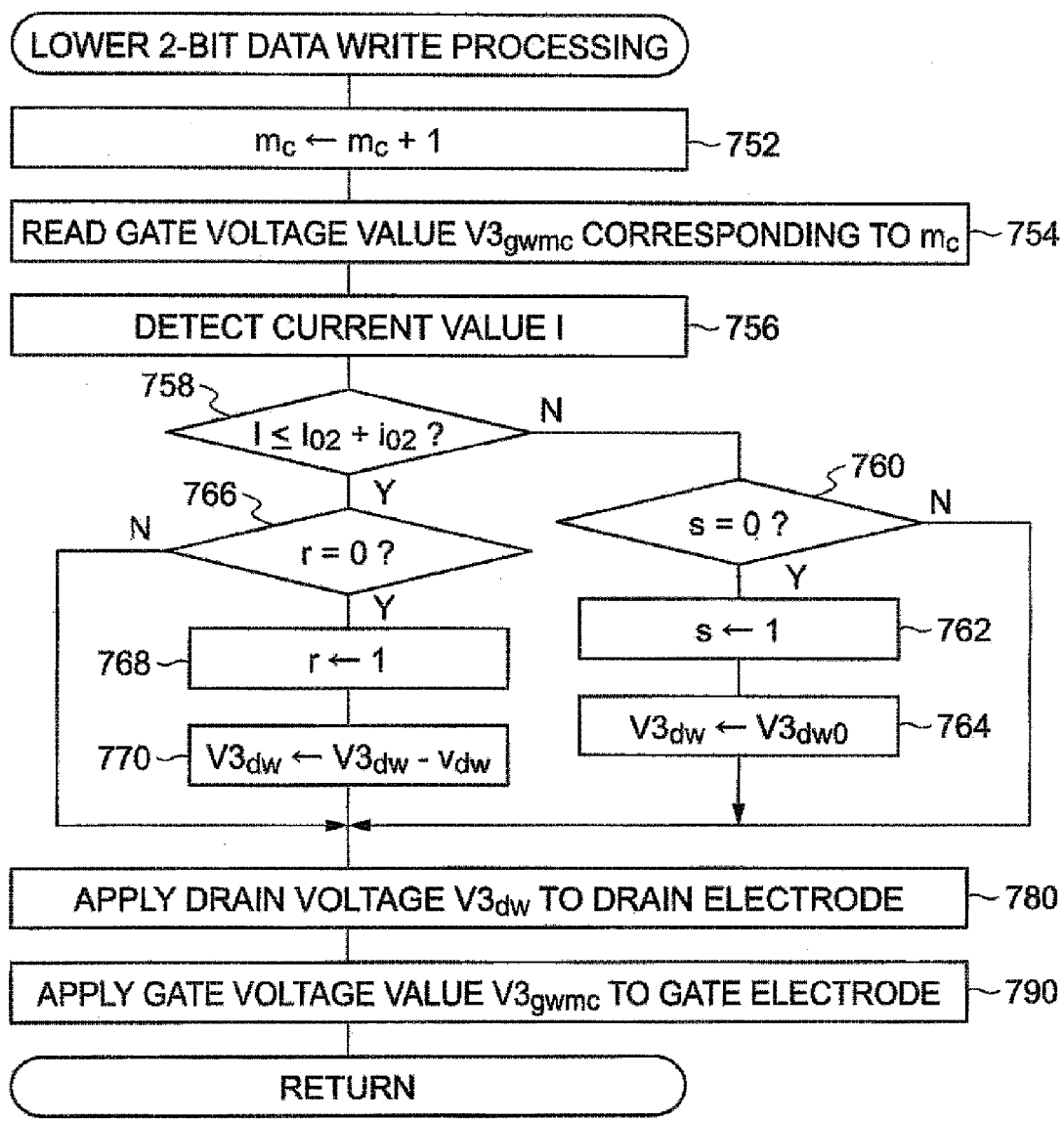
FIG. 13 is a flow chart showing process flow of a data writing program of lower 2-bit data of step 509 of FIG. 11.

Detailed explanation follows of write processing of lower bit data of step 509 of FIG. 11, with reference to FIG. 13.

Since the write processing of the lower bit data of the current step is also similar to the write processing of the lower bit data shown in FIG. 10, a detailed explanation is abbreviated. However, in the current processing too, when the value I of current flowing in the channel region becomes a value corresponding to the amount of charge accumulated in the second charge accumulating section 32 for 10 data, in a region where the current flowing in the channel region is greater than the predetermined target value $I_{02}$, as the current value I approaches to the target value $I_{02}$ (when it becomes a value greater than $I_{02}$ by the specific amount $i_{02}$ then the rate of increase in charge accumulating amount per time is decreased once. Namely, as described above, since the rate of increase in charge accumulating amount per time is decreased, as shown at the right hand side of FIG. 15C, the drain voltage drops by a specific value from 6.0V, for example by 1.0V, to become 5.0V. Note that the gate voltage, as shown at the right hand side of FIG. 15B, starts from 7.0V and is increased by 0.1V as the number of times of writing increases.

Figure 14F:
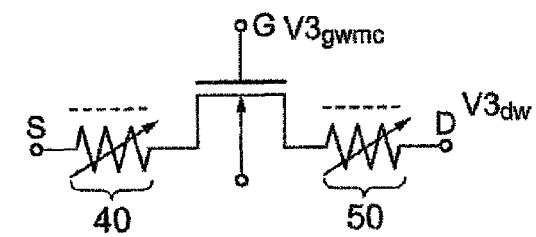

Then, in step 780 and step 790, the gate voltage value $V3_{gwmc}$ determined as described above and drain voltage $V3_{dw}$ are applied, as shown in FIG. 14F to the gate electrode 24 and the drain electrode 18.

In the present exemplary embodiment as explained above, when the value of current flowing in the channel region becomes a value corresponding to the amount of charge accumulated in the first and second charge accumulating sections 30 or 32 for specific data (01, 10), in a region where the current flowing in the channel region is greater than the predetermined target value, by lowering the source voltage and/or the drain voltage when the current value approaches to the target value, the rate of increase in charge accumulating amount per time is decreased once. Consequently, excessive writing can be suppressed, and the accumulating amount of charge to each of the charge accumulating sections can be suppressed from exceeding the target values.

Figure 21A:
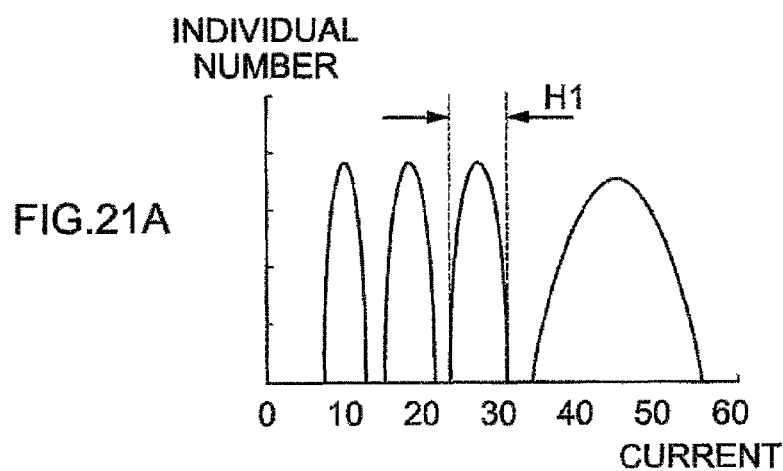
FIG. 21A is a graph showing current value distribution widths for respective data in conventional technology (JP-A No. 2008-85196)
Figure 21B:
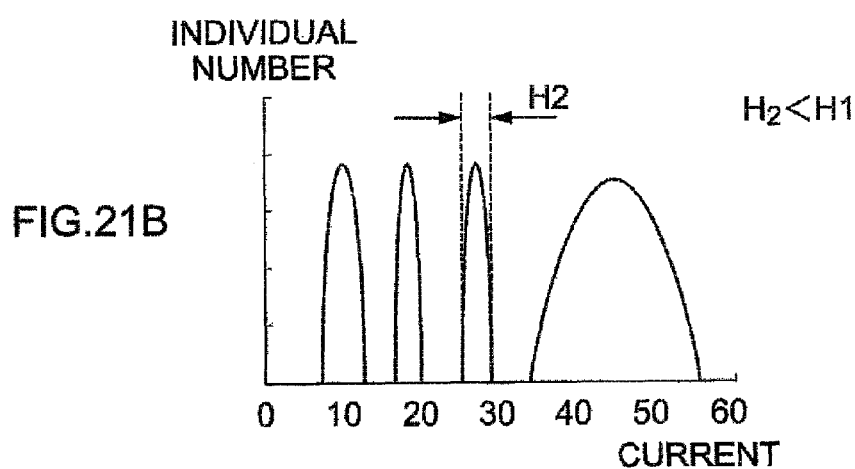
FIG. 21B is a graph showing the current value distribution widths of respective data in the first exemplary embodiment.

Consequently, as shown in FIG. 21B, a current value distribution width H2 can be made narrower than a current value distribution width H1 (FIG. 21A) of conventional technology, and the current window can be made wider.

Second Exemplary Embodiment

Explanation follows of a second exemplary embodiment of the present invention. Since the configuration of the present exemplary embodiment is similar to the configuration of the above first exemplary embodiment, explanation thereof is omitted. Furthermore, there are also portions of the operation of the present exemplary embodiment that are similar to those of the first exemplary embodiment, so explanation is given below only of the differing portions thereof.

Figure 20A:
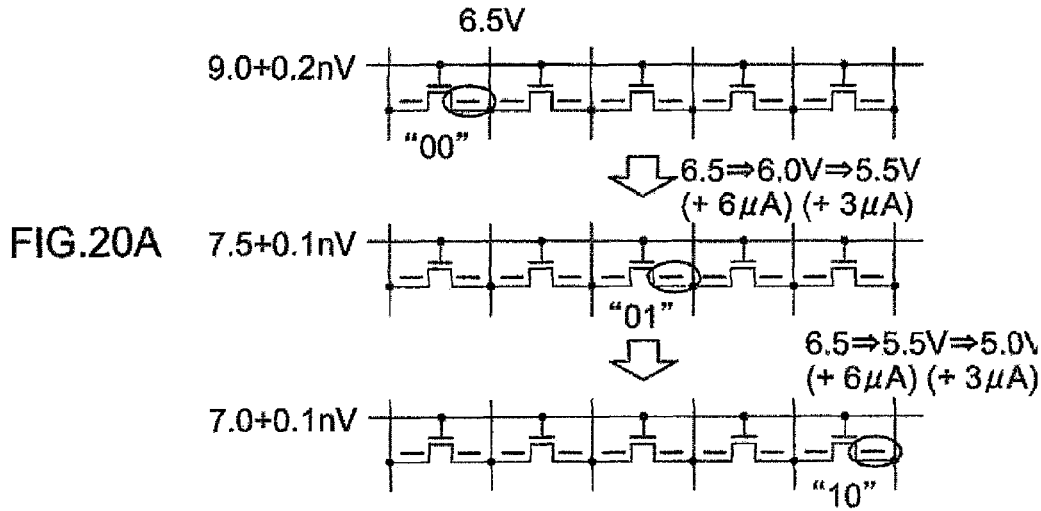
FIG. 20A is a diagram showing a writing sequence of plural memory cells in the second exemplary embodiment.
Figure 20B:
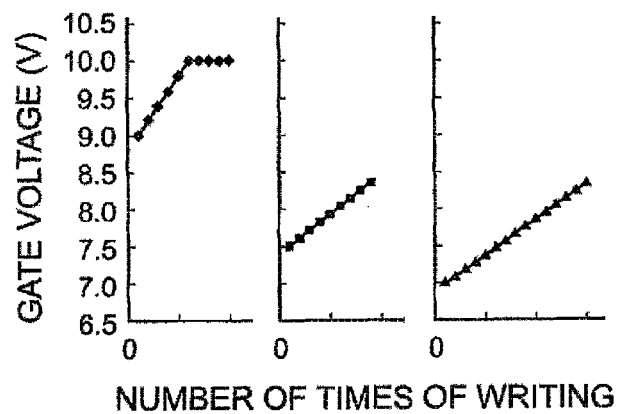
FIG. 20B is a graph showing the gate voltage being gradually increased along with an increase in the number of times of writing.

Namely, the steps 300M to 500M of FIG. 4 are executed similarly to in the above first exemplary embodiment. Namely, as shown in FIG. 20A, 00 data is written in sequence to each of plural memory cells, 01 data is written in sequence to each of plural memory cells, and 10 data is written in sequence to plural memory cells.

Figure 16:
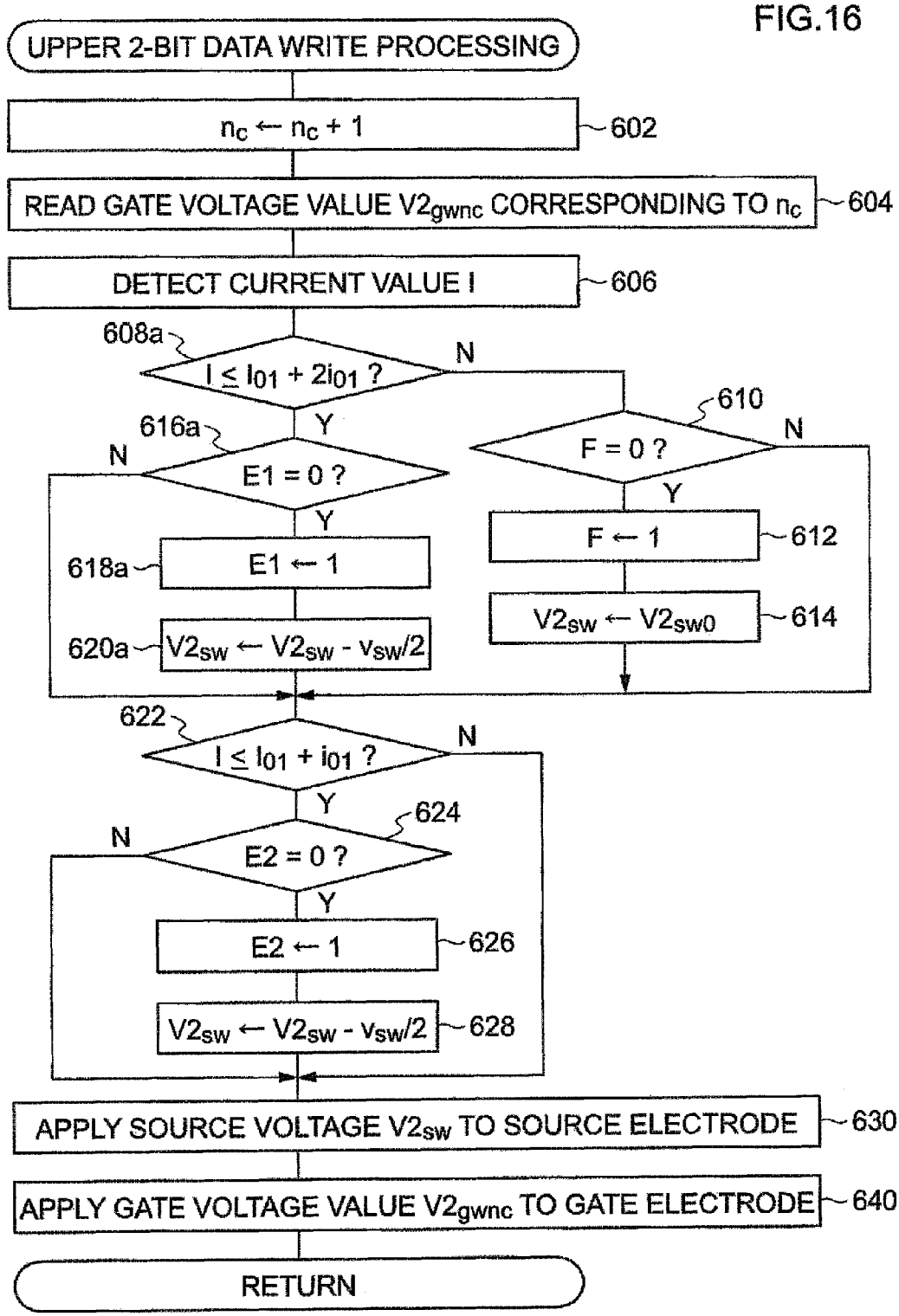
FIG. 16 is a flow chart showing a process flow of a data writing program of upper 2-bit data of step 403 of FIG. 8 in a second exemplary embodiment.
Figure 17:
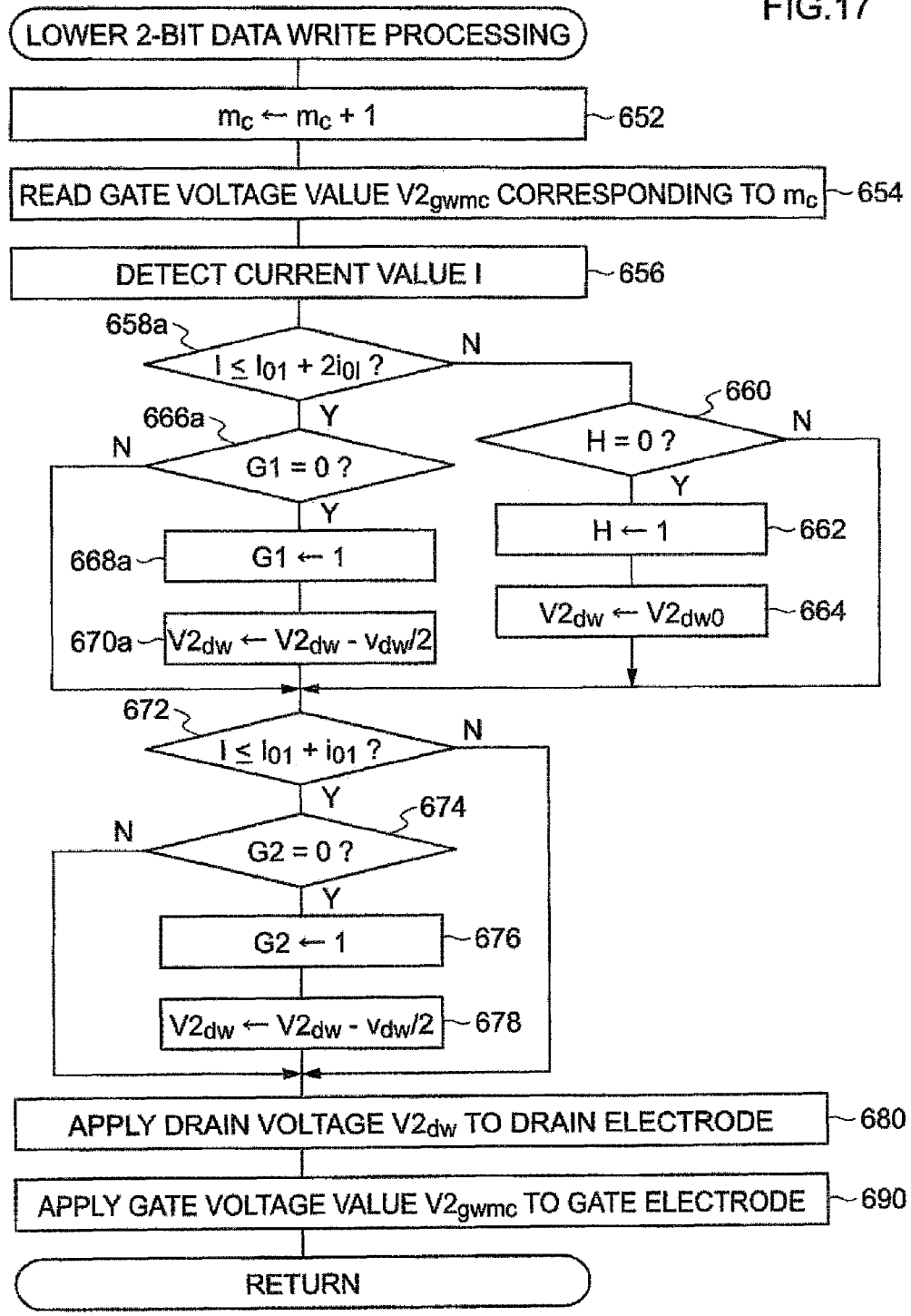
FIG. 17 is a flow chart showing a process flow of a data writing program of lower 2-bit data of step 409 of FIG. 8 in the second exemplary embodiment.
Figure 18:
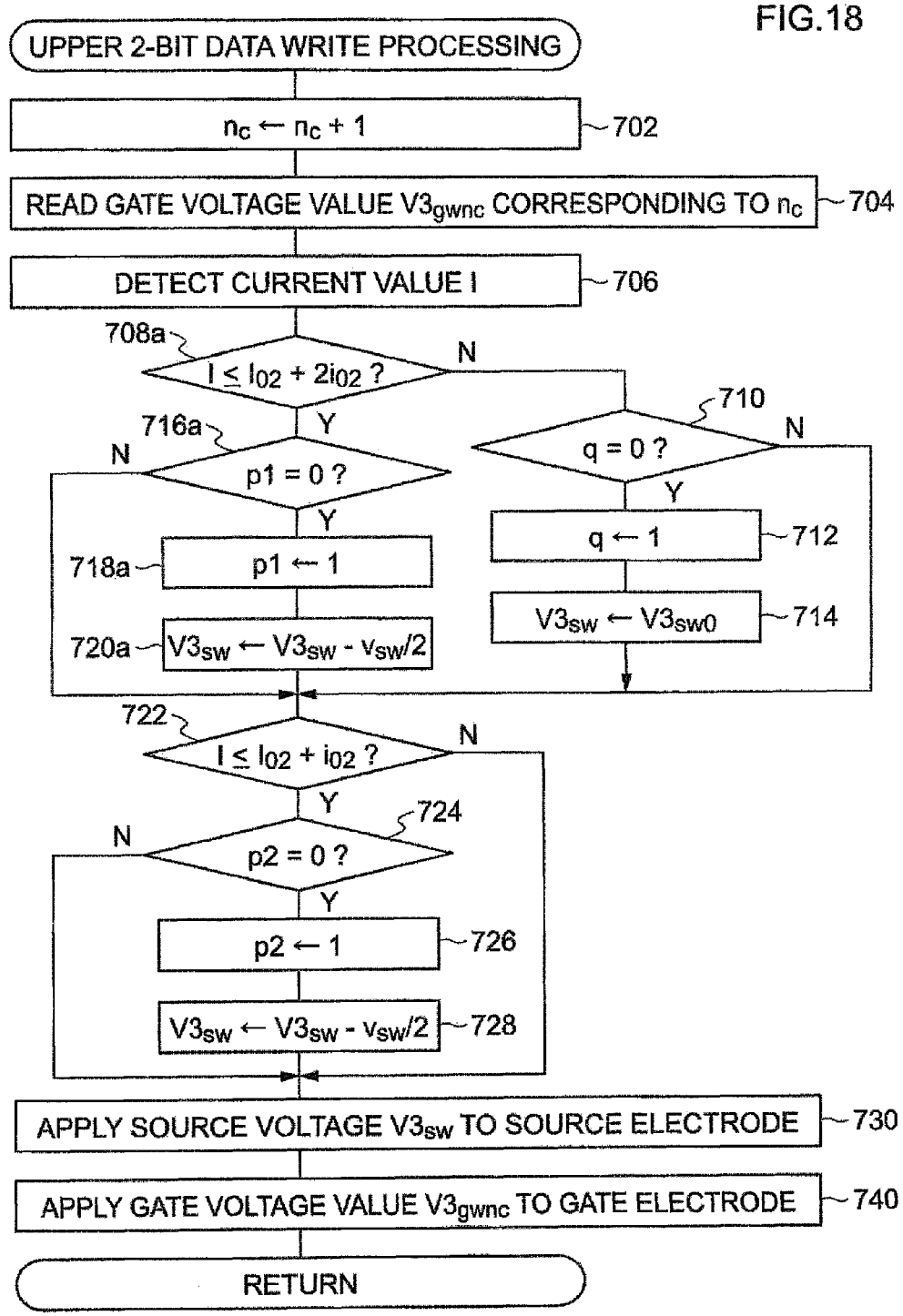
FIG. 18 is a flow chart showing a process flow of a data writing program of upper 2-bit data of step 503 of FIG. 11 in the second exemplary embodiment.
Figure 19:
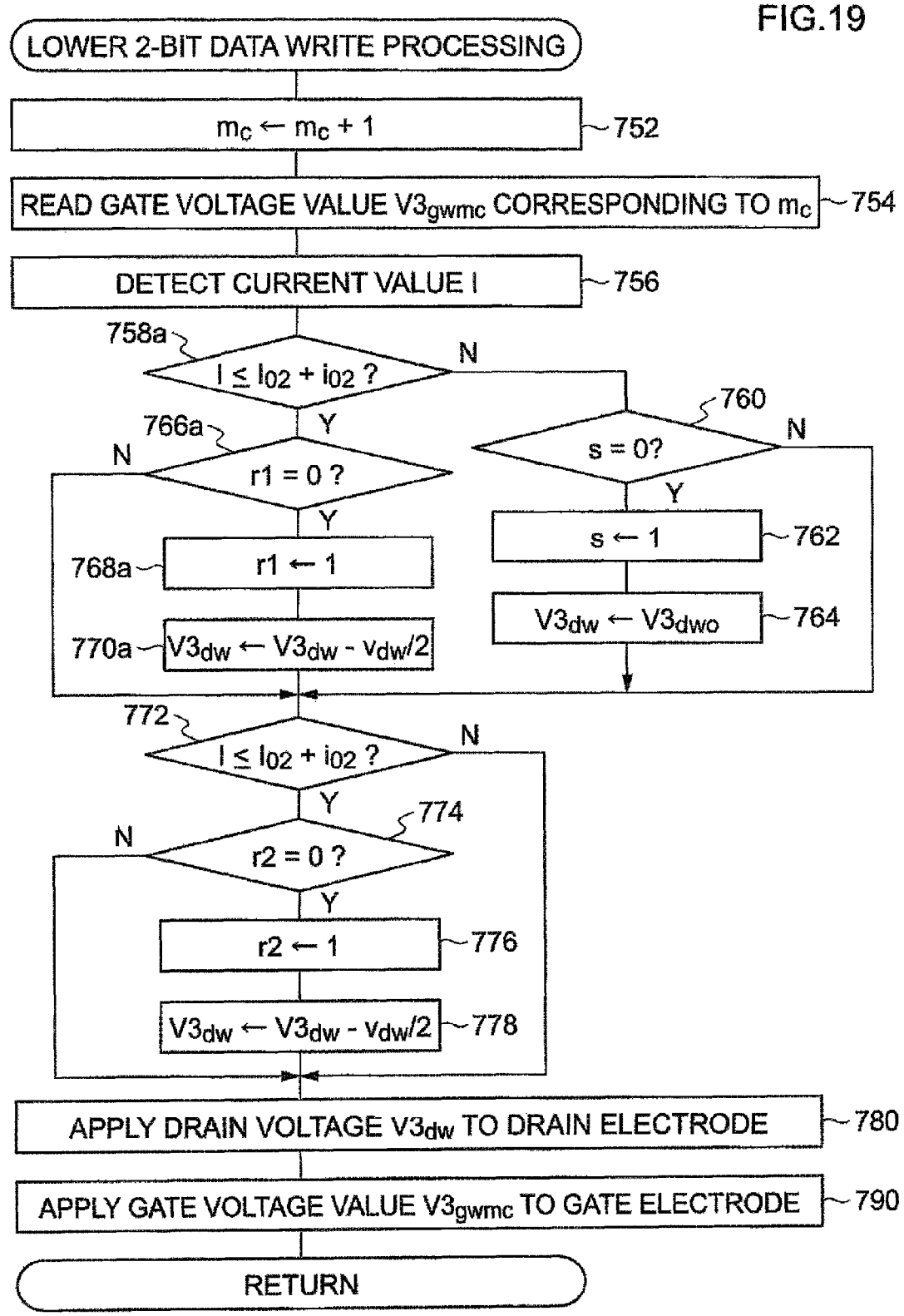
FIG. 19 is a flow chart showing a process flow of a data writing program of lower 2-bit data of step 509 of FIG. 11 in the second exemplary embodiment.

Furthermore, in the present exemplary embodiment too, processing is executed similar to the processing shown in FIG. 5 (FIG. 6, FIG. 7). Furthermore, in the present exemplary embodiment too, substantially the same processing is executed as the processing shown in FIG. 8 and FIG. 11 as step 400M and step 500M of FIG. 4. However, in the present exemplary embodiment, the processing shown in FIG. 16 and FIG. 17 is executed in place of the processing shown in FIG. 9 and FIG. 10 corresponding to the processing of step 403 and step 409 shown in FIG. 8. In the present exemplary embodiment, processing shown in FIG. 18 and FIG. 19 is executed in place of processing shown in FIG. 12 and FIG. 13 corresponding to the processing of step 503 and step 509 shown in FIG. 11.

Explanation follows of the contents of the processing shown in FIGS. 16 to 19.

First, since the processing of step 602 and step 604 of FIG. 16, showing step 403 of processing shown in FIG. 8 (write processing of upper 2-bit data during write processing of 01 data), is similar to the processing of step 602 and step 604 of FIG. 9, further explanation thereof is omitted.

Figure 20C:
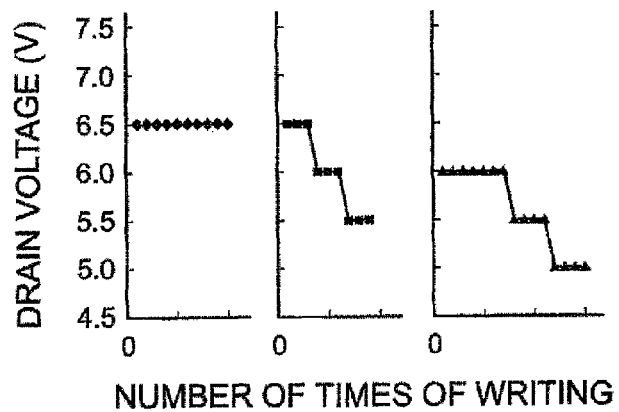
FIG. 20C is a graph showing the drain voltage being constant when writing 00 data, and being reduced stepwise twice as the number of times of writing increases when writing 01 data and 10 data.

In the present exemplary embodiment, as shown in the center of FIG. 20C, the drain voltage (this also applies to the source voltage) is initially a constant 6.5V, even though the above number of times of writing increases. However, when the value I of current flowing in the channel region has become a value corresponding to the amount of charge accumulated in the first charge accumulating section 30 for 01 data, in a region where the current flowing in the channel region is greater than the predetermined target value $I_{01}$, as the current value I approaches to the target value $I_{01}$ (when it becomes a value greater than $I_{01}$ by a specific amount $2 \times i_{01}$), the source voltage is lowered from 6.5V by a specific value, for example by 0.5V, becoming 6.0V, and, when the current value I gets even nearer to the target value $I_{01}$ (when it becomes a value greater than $I_{01}$ by the specific amount $i_{01}$), the source voltage is lowered further, becoming 5.5V.

In order to execute the above processing, first, at step 606, the current value I is detected as described above, then at step 608a, determination is made as to whether or not the current value I has got near to the target value $I_{01}$ (become $I_{01}+2 \times i_{01}$, or less). When this determination is negative, the above steps 610 to 614 are executed.

However, when the current value I is first determined to have become $I_{01}+2 \times i_{01}$, or less, then determination is positive at step 616a, of whether or not a flag E1, indicating when the determination is first made that the current value I is $I_{01}+2 \times i_{01}$, or less, is 0. Then, at step 618a, flag E1 is set to 1, and at step 620a the present source voltage $V2_{sw}$ ($V2_{sw0}$ (6.5V)) is lowered by a specific value ($v_{sw}/2$) (for example, the same as the above, 0.5V), and the lowered value is set as the source voltage $V2_{sw}$.

At the next step 622, determination is made as to whether or not the current value I has got even nearer to target value $I_{01}$ (become $I_{01}+i_{01}$, or less). When this determination is positive, then at step 624, determination is made as to whether or not a flag E2, indicating when the determination is first made that the current value I is $I_{01}+i_{01}$, or less, is 0. When determination at step 624 is positive, namely, when the initial determination is that the current value I is $I_{01}+i_{01}$, or less, then at step 626, flag E2 is set to 1, and at step 628 the present source voltage $V2_{sw}$ (V (6.0V)) is further lowered by the specific value ($v_{sw}/2$), and the lowered value is set as the source voltage $V2_{sw}$.

Thereafter, the above step 630 and step 640 are executed.

The above processing shown in FIG. 16, as described above, is write processing of the upper 2-bit data in the write processing of 01 data, however, since the processing shown in FIG. 17 is the same as the processing shown in FIG. 16, except in that it is the write processing of the lower 2-bit data in the write processing of 01 data, further explanation is omitted.

Processing shown in FIG. 18 is the same as the processing shown in FIG. 16, except in that it is the write processing of the upper 2-bit data in the write processing of 10 data, therefore further explanation is omitted. Furthermore, the processing shown in FIG. 19 is the same as the processing shown in FIG. 16, except in that it is the write processing of the lower 2-bit data in the write processing of 10 data, therefore further explanation is omitted.

In the second exemplary embodiment of the present invention as explained above, when the value of current flowing in the channel region becomes a value corresponding to the amount of charge accumulated in the first or second charge accumulating sections 30, 32 for specific data (01 or 10), in a region where the current flowing in the channel region is greater than the predetermined target values, as the current value approaches to the target values, by lowering the source voltage and/or the drain voltage, and by lowering the source voltage and/or the drain voltage more as the current value gets even nearer to the target value, the rate of increase in charge accumulating amount per time is decreased twice. Consequently, the charge amount of charge to each of the charge accumulating sections can be further suppressed from exceeding the target value.

Figure 21C:
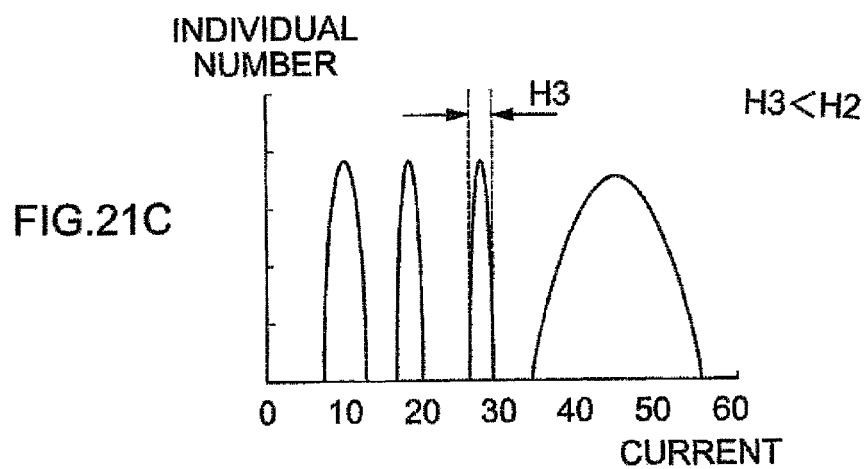
FIG. 21C is a graph showing the current value distribution widths of respective data in the second exemplary embodiment.

Consequently, as shown in FIG. 21C, a current value distribution width H3 can be made smaller than a current value distribution width H1 (FIG. 21A) of conventional technology and smaller than the current value distribution width H2 of the above first exemplary embodiment (FIG. 21B), and the current window can be made even wider.

Exemplary Modification

In the first exemplary embodiment and the second exemplary embodiment explained above, as the gate voltage is gradually increased according to the number of times of writing, as the above current value approaches to the above target values, the source voltage and/or the drain voltage is lowered stepwise, lowered once or lowered twice. However, the present invention is not limited thereto, and the source voltage and/or the drain voltage may be lowered stepwise a greater number of times, in finer steps as the current value gets nearer to the above target values.

Figure 22:
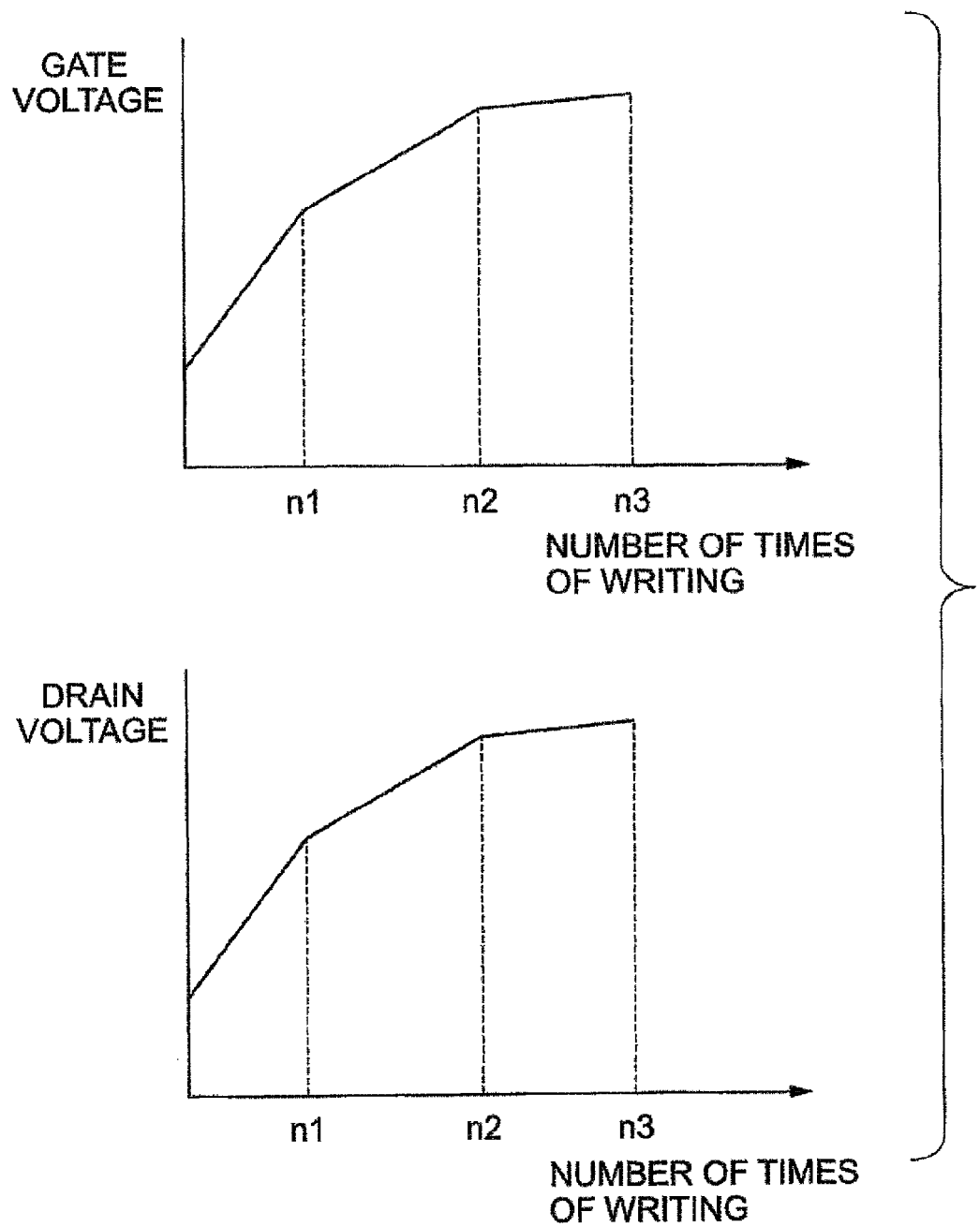
FIG. 22 is of an exemplary modification, and is a graph showing the manner in which the gate voltage and the drain voltage are increased as the number of write time increases.
Figure 23:
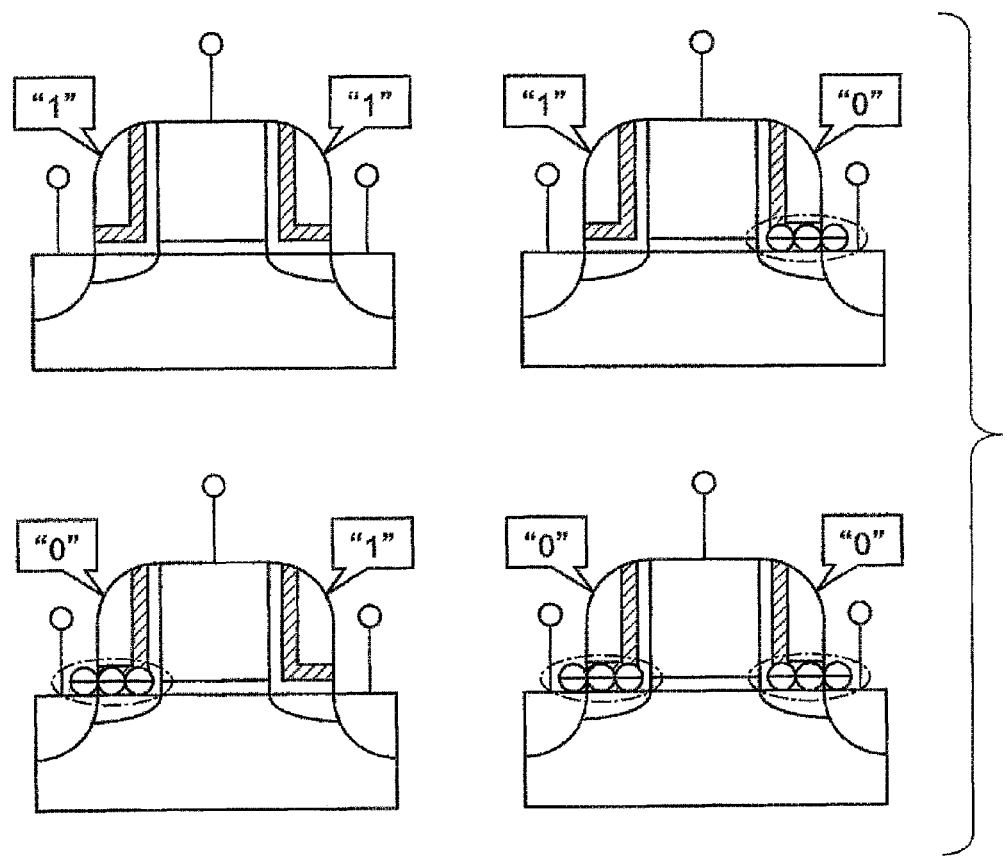
FIG. 23 is a schematic diagram showing states of each of the charge accumulating sections when 2-bit data is stored in a memory cell described in JP-A No. 2005-64295.
Figure 24:
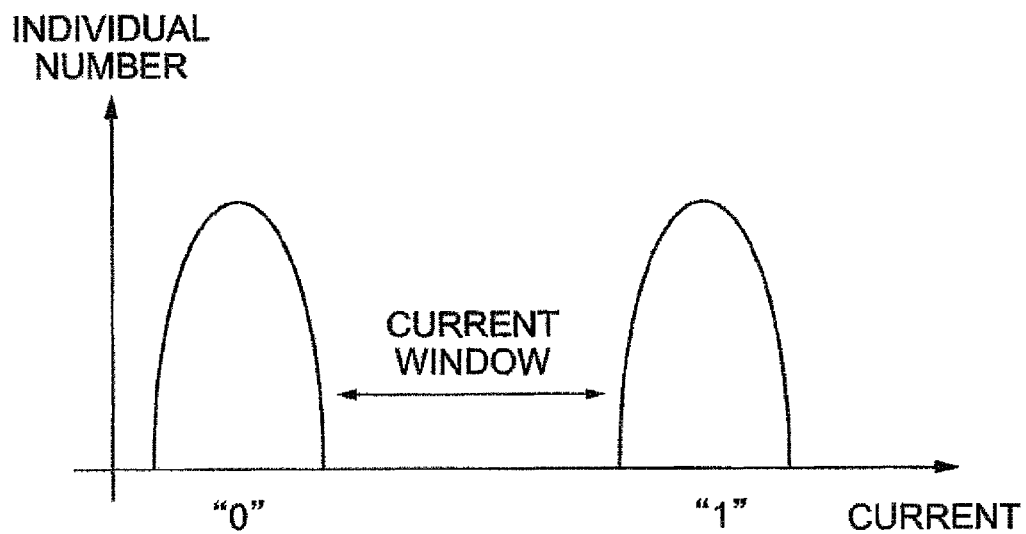
FIG. 24 is a graph showing read current value distributions in an integration of memory cells described in JP-A No. 2005-64295.
Figure 25:
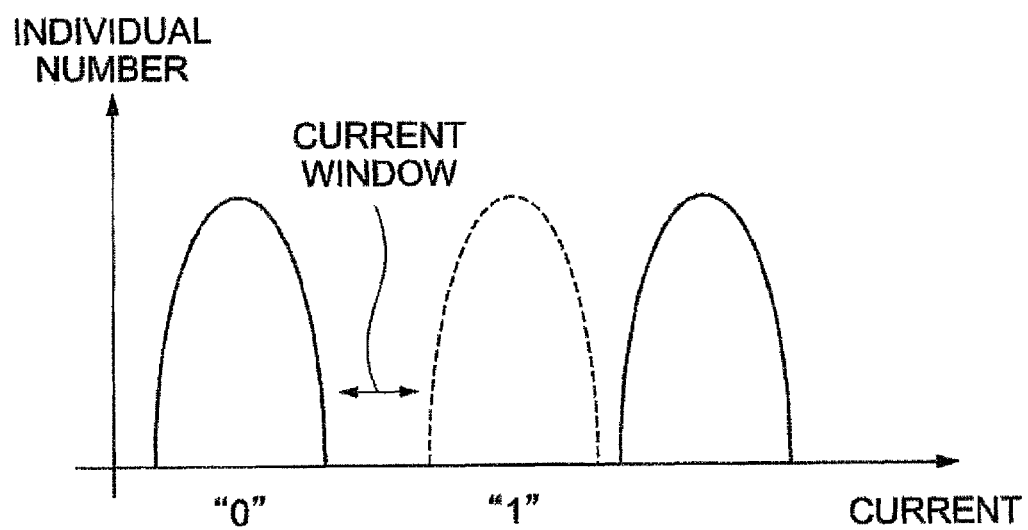
FIG. 25 is a graph showing read current value distributions, showing a state in which the read current value falls on the mirror side in an integration of memory cells described in JP-A No. 2005-64295.
Figure 26A:
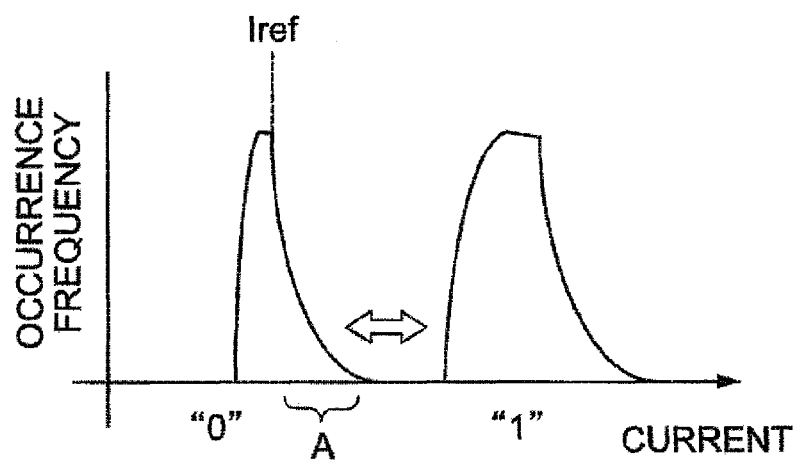
FIG. 26A is a diagram showing the manner in which the current value distribution widens and the current window becomes narrower due to memory cells with insufficient writing.
Figure 26B:
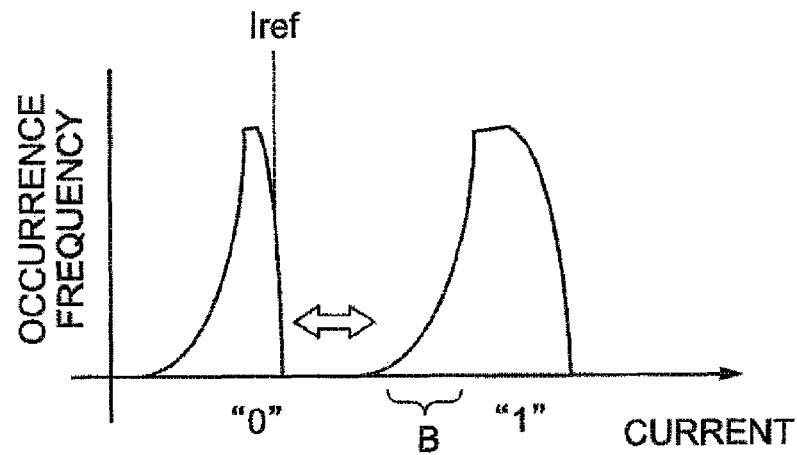
FIG. 26B is a diagram showing the manner in which the current value distribution widens and the current window becomes narrower due to memory cells with excessive writing.
Figure 27:
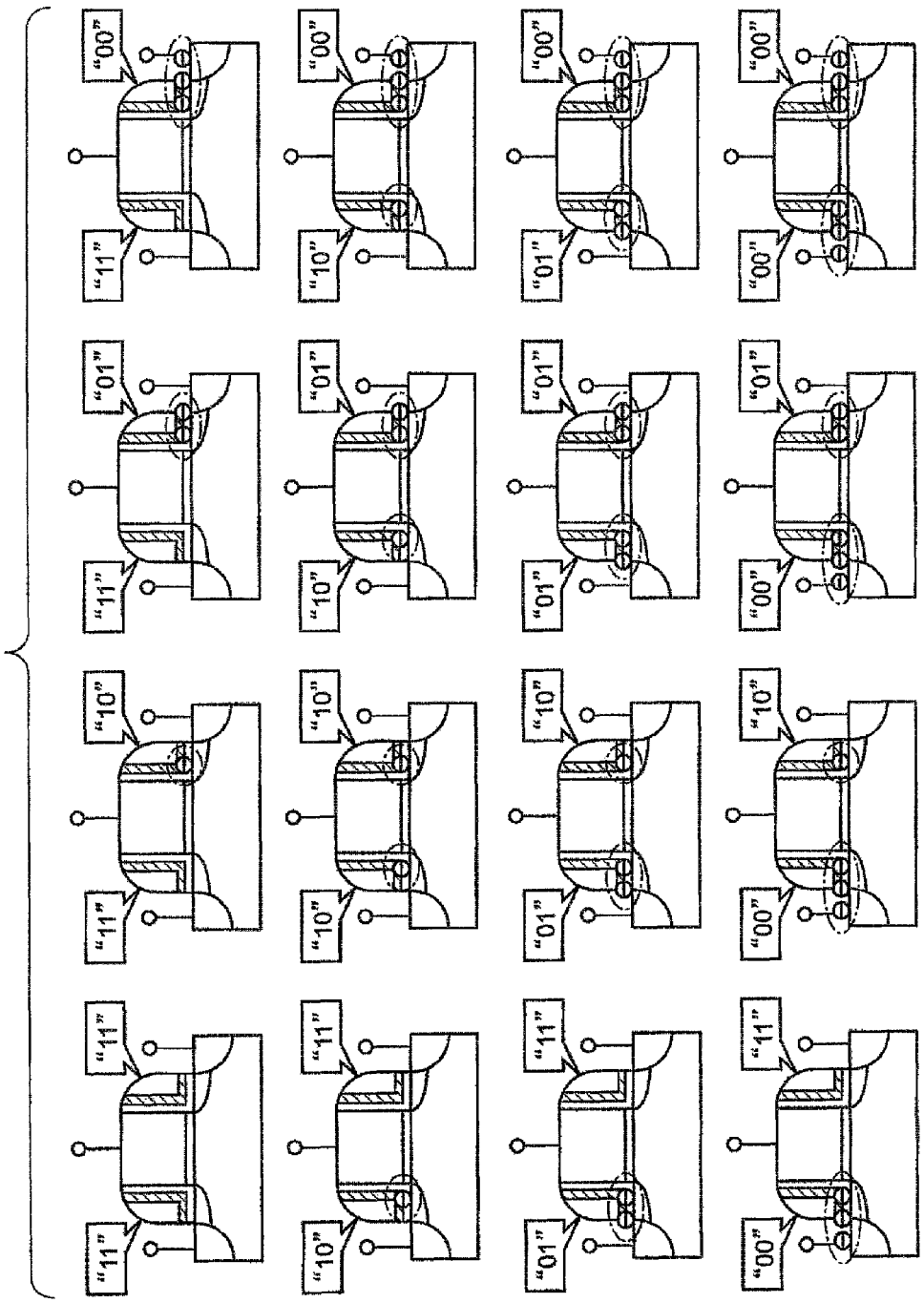
FIG. 27 is a diagram schematically showing states of each charge accumulating section when data of 4-bits is stored in a memory cell described in JP-A No. 2005-64295.
Figure 28:
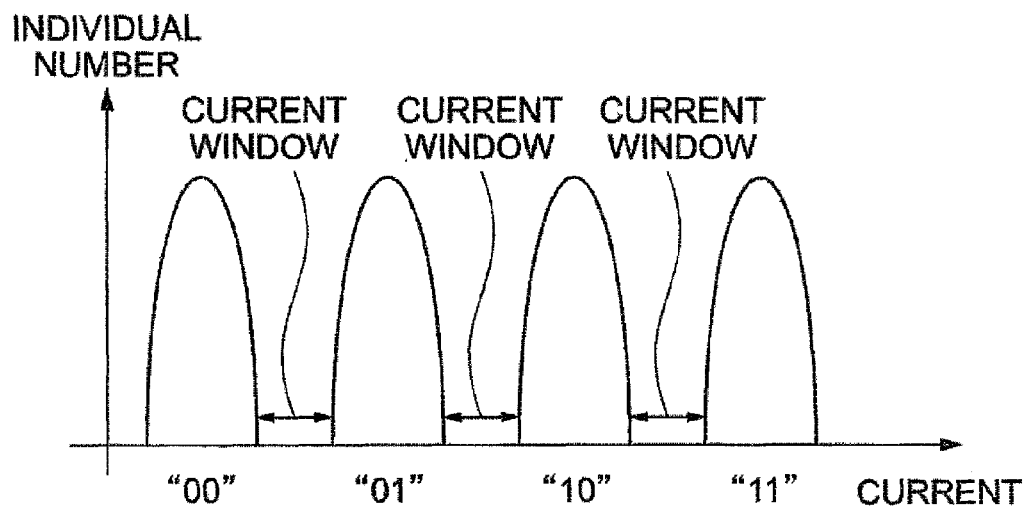
FIG. 28 is a graph showing read current value distribution in a memory cell integration, when data of 4-bits is stored in a memory cell described in JP-A No. 2005-64295.
Figure 29:
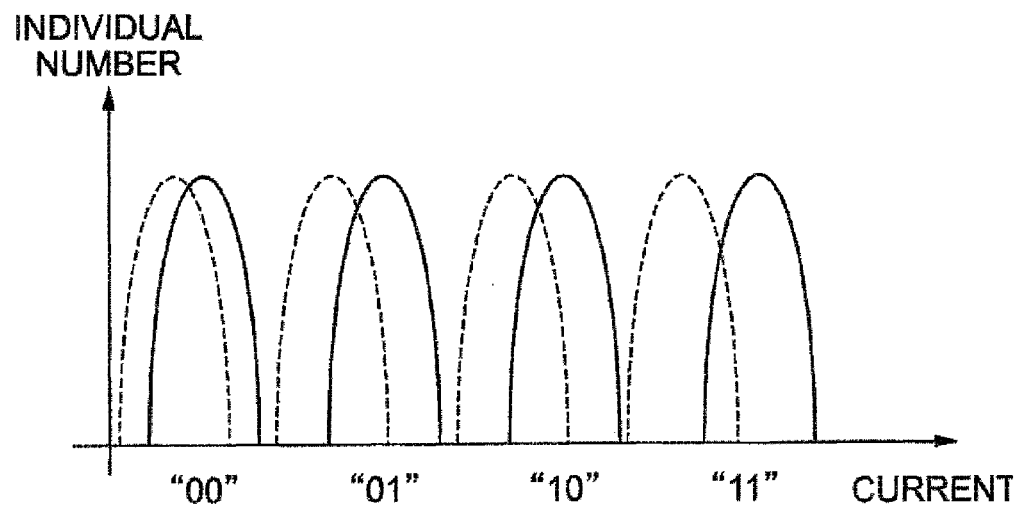
FIG. 29 is a graph showing read current value distribution in a memory cell integration, when attempting to store data of 4-bits in a memory cell described in JP-A No. 2005-64295, showing a state of a fall in read current value on the mirror side.
Figure 30A:
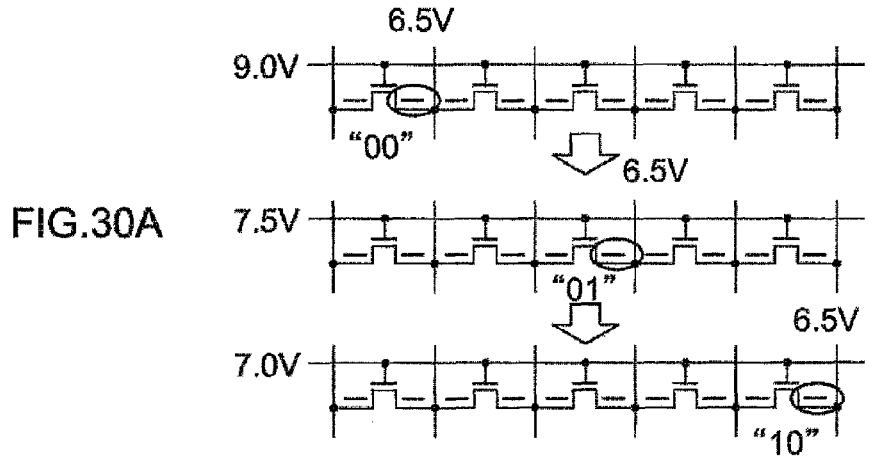
FIG. 30A is a diagram showing a sequence of writing of plural memory cells in the technology of JP-A No. 2008-85196.
Figure 30B:
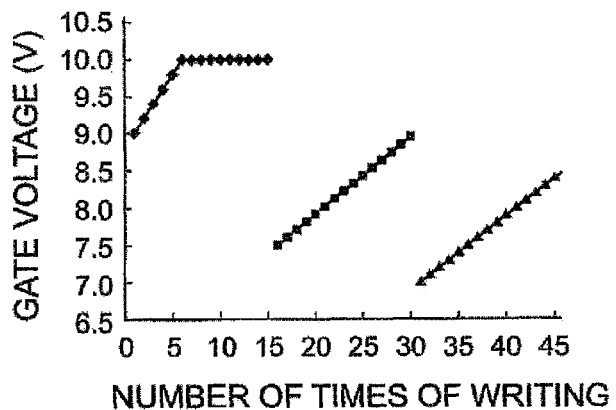
FIG. 30B is a graph showing the gate voltage being gradually increased as the number of times of writing increases.
Figure 30C:
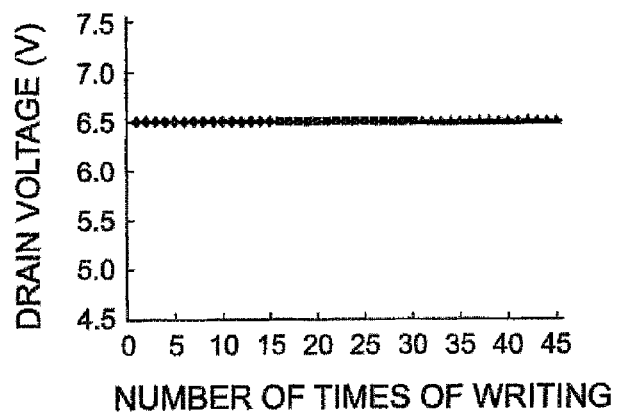
FIG. 30C is a graph showing the drain voltage being always constant, independent of the number of times of writing.

Furthermore, in the above first exemplary embodiment and second exemplary embodiment, the gate voltage is gradually increased according to the number of times of writing, and the source voltage and/or the drain voltage is lowered stepwise at least once when the above current value approaches to the above target values. However, the present invention is not limited thereto, and the source voltage and/or the drain voltage may be gradually increased according to the number of times of writing, and the gate voltage may be lowered stepwise at least once when the above current value approaches to the above target value. Furthermore, as shown in FIG. 22, the gate voltage, source voltage, and drain voltage may be gradually increased according to the number of times of writing, and the gate voltage may be lowered stepwise at least once when the above current value approaches to the above target value.

Furthermore, in the first exemplary embodiment and the second exemplary embodiment, the gate voltage, the source voltage, or the drain voltage are changed such that the rate of increase of accumulating amount of charge per time decreases, however the present invention is not limited thereto. Configuration may be made such that the gate voltage, the source voltage, and the drain voltage are left unchanged and the duration of voltage application is changed, or the voltage of the gate voltage, source voltage, and drain voltage and also the duration of application is changed.

Furthermore, in the above first exemplary embodiment and second exemplary embodiment, there is no limitation to writing the same data in sequence to plural memory cells, and the same data may be written simultaneously. Furthermore, configuration may be made such that the sequence of plural memory cells is commuted and data corresponding to each of the memory cells is written plural times.

What is claimed is:

1. A semiconductor non-volatile memory comprising:
a plurality of memory sections, each memory section comprising:
a substrate, equipped with a source region, a drain region, a channel region between the source region and the drain region, a first variable resistance region between the channel region and the source region, the first variable resistance region having a specific concentration of an impurity and having a variable resistance, and a second variable resistance region between the channel region and the drain region, the second variable resistance region having a specific concentration of an impurity and having a variable resistance;
a source electrode, disposed in a position on the substrate corresponding to the source region;
a drain electrode, disposed in a position on the substrate corresponding to the drain region;
a gate electrode, disposed in a position on the substrate corresponding to the channel region;
a current detection section that detects a value of current flowing in the channel region;
at least one first charge accumulating section, disposed in a position on the substrate corresponding to the first variable resistance region, and accumulating charge of an amount corresponding to an application state of voltage applied to the source electrode and the gate electrode; and
at least one second charge accumulating section, disposed in a position on the substrate corresponding to the second variable resistance region, and accumulating charge of an amount corresponding to the application state of voltage applied to the drain electrode and the gate electrode;
a voltage application section that selectively applies a voltage to the source electrode, the drain electrode, and the gate electrode; and
a control section that controls the voltage application section, such that voltage is applied a plurality of times between the gate electrode and at least one of the source electrode or the drain electrode, until the amount of charge accumulated in at least one of the respective first charge accumulating section or the respective second charge accumulating section of the plurality of memories is a specific value, and changes the voltage application state such that as the number of times that the voltage is applied increases, a charge accumulating amount per time increases,
wherein the control section controlling voltage application such that, based on a value of current detected by the current detection section, in a region where the current flowing in the channel region is greater than a predetermined target value at which the amount of charge accumulated has become a specific value in at least one of the first charge accumulating section or the second charge accumulating section, when a value of current flowing in the channel region approaches the target value, a rate of increase in the charge accumulating amount per time is decreased at least once.

2. The semiconductor non-volatile memory of claim 1, wherein the control section controls the voltage application section such that a value of the voltage applied to the gate electrode is increased gradually according to the increase in number of times that the voltage is applied, and the value of the voltage applied to at least one of the source electrode or the drain electrode is made smaller stepwise according to a value of the current flowing in the channel region.

3. The semiconductor non-volatile memory of claim 1, wherein the control section controls the voltage application section such that a value of the voltage applied to the gate electrode is made smaller stepwise according to a value of the current flowing in the channel region and the value of the voltage applied to at least one of the source electrode or the drain electrode is increased gradually according to the increase in number of times.

4. The semiconductor non-volatile memory of claim 1, wherein the control section increases the voltage applied to at least one of the gate electrode, the source electrode, or the drain electrode according to the increase in number of times that the voltage is applied, and a rate of increase is made smaller stepwise according to the value of the current flowing in the channel region.

5. The semiconductor non-volatile memory of claim 1, wherein the control section controls the voltage application section, such that selective accumulating is made of one or other of a plurality of charges of different magnitudes in at least one of the respective first charge accumulating section or the respective second charge accumulating section of the plurality of memory sections, and voltage is applied either at the same time, or successively, to a plurality of memory cells to trap charge of the same magnitude.

6. The semiconductor non-volatile memory of claim 1, wherein the control section controls the voltage application section such that a respective sequence of the plurality of memory sections is commuted, and selective accumulating is made of one or other of a plurality of charges of different magnitudes in at least one of the first charge accumulating section or the second charge accumulating section of each of the plurality of memory sections.

7. A semiconductor non-volatile memory charge accumulating method for a semiconductor non-volatile memory comprising:
   a plurality of memory sections, each memory section comprising:
      a substrate, equipped with a source region, a drain region, a channel region between the source region and the drain region, a first variable resistance region between the channel region and the source region, the first variable resistance region having a specific concentration of an impurity and having a variable resistance, and a second variable resistance region between the channel region and the drain region, the second variable resistance region having a specific concentration of an impurity and having a variable resistance;
      a source electrode, disposed in a position on the substrate corresponding to the source region;
      a drain electrode, disposed in a position on the substrate corresponding to the drain region;
      a gate electrode, disposed in a position on the substrate corresponding to the channel region;
      a current detection section that detects a value of current flowing in the channel region;
      at least one first charge accumulating section, disposed in a position on the substrate corresponding to the first variable resistance region, and accumulating charge of an amount corresponding to an application state of voltage applied to the source electrode and the gate electrode; and
      at least one second charge accumulating section, disposed in a position on the substrate corresponding to the second variable resistance region, and accumulating charge of an amount corresponding to the application state of voltage applied to the drain electrode and the gate electrode;
   a voltage application section that selectively applies a voltage to the source electrode, the drain electrode, and the gate electrode; and
   a control section that controls the voltage application section, such that voltage is applied a plurality of times between the gate electrode and at least one of the source electrode or the drain electrode, until the amount of charge accumulated in at least one of the respective first charge accumulating section or the respective second charge accumulating section of the plurality of memories is a specific value, and changes the voltage application state such that as the number of times that the voltage is applied increases, a charge accumulating amount per time increases,
   the method comprising:
      by the control section, determining, based on a value of current detected by the current detection section, in a region where the current flowing in the channel region is greater than a predetermined target value at which the amount of charge accumulated has become a specific value in at least one of the first charge accumulating section or the second charge accumulating section, whether or not the value of current flowing in the channel region approaches the target value, and
      by the control section, controlling the voltage application section such that the rate of increase in the charge accumulating amount per time is decreased when it is determined that the value of current approaches the target value.

8. A charge accumulating program storage medium that stores a charge accumulating program that instructs a computer executing steps for accumulating a charge in a semiconductor non-volatile memory comprising a plurality of memory sections, each memory section comprising:
   a substrate, equipped with a source region, a drain region, a channel region between the source region and the drain region, a first variable resistance region between the channel region and the source region, the first variable resistance region having a specific concentration of an impurity and having a variable resistance, and a second variable resistance region between the channel region and the drain region, the second variable resistance region having a specific concentration of an impurity and having a variable resistance;
   a source electrode, disposed in a position on the substrate corresponding to the source region;
   a drain electrode, disposed in a position on the substrate corresponding to the drain region;
   a gate electrode, disposed in a position on the substrate corresponding to the channel region;
   a current detection section that detects a value of current flowing in the channel region;
   at least one first charge accumulating section, disposed in a position on the substrate corresponding to the first variable resistance region, and accumulating charge of an amount corresponding to an application state of voltage applied to the source electrode and the gate electrode; and
   at least one second charge accumulating section, disposed in a position on the substrate corresponding to the second variable resistance region, and accumulating charge of an amount corresponding to the application state of voltage applied to the drain electrode and the gate electrode;

a voltage application section that selectively applies a voltage to the source electrode, the drain electrode, and the gate electrode; and a control section that controls the voltage application section, such that voltage is applied a plurality of times between the gate electrode and at least one of the source electrode or the drain electrode, until the amount of charge accumulated in at least one of the respective first charge accumulating section or the respective second charge accumulating section of the plurality of memories is a specific value, and changes the voltage application state such that as the number of times that the voltage is applied increases, the charge accumulating amount per time increases, wherein the steps comprising:

by the control section, determining, based on a value of current detected by the current detection section, in a region where the current flowing in the channel region is greater than a predetermined target value at which the amount of charge accumulated has become a specific value in at least one of the first charge accumulating section or the second charge accumulating section, whether or not the value of current flowing in the channel region approaches the target value, and by the control section, controlling the voltage application section such that a rate of increase in the charge accumulating amount per time is decreased when it is determined that the value of current approaches the target value.

* * * * *